US012684838B2

(12) United States Patent
Raghunathan et al.

(10) Patent No.: US 12,684,838 B2
(45) Date of Patent: Jul. 14, 2026

(54) STRUCTURE AND RELATED METHOD FOR SOURCE/DRAIN TERMINAL WITHIN SUBCOLLECTOR

(71) Applicant: GlobalFoundries U.S. Inc., Malta, NY (US)

(72) Inventors: Uppili S. Raghunathan, Essex Junction, VT (US); Aaron L. Vallett, Jericho, VT (US); Venkata Narayana Rao Vanukuru, Bangalore (IN); Steven M. Shank, Jericho, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 158 days.

(21) Appl. No.: 18/915,624

(22) Filed: Oct. 15, 2024

(65) Prior Publication Data

US 2026/0107529 A1    Apr. 16, 2026

(51) Int. Cl.
H10D 62/13 (2025.01)
H10D 64/23 (2025.01)
H10D 84/40 (2025.01)

(52) U.S. Cl.
CPC ......... H10D 62/137 (2025.01); H10D 64/231 (2025.01); H10D 84/401 (2025.01)

(58) Field of Classification Search
CPC .. H10D 10/461; H10D 10/052; H10D 62/137; H10D 62/138; H10D 84/401; H10D 84/403; H10D 84/406; H03F 1/22
See application file for complete search history.

(56) References Cited

U.S. PATENT DOCUMENTS

| | | | | |
|---|---|---|---|---|
| 5,097,312 A | * | 3/1992 | Bayraktaroglu | ....... H10D 84/01 257/E27.012 |
| 8,212,291 B2 | | 7/2012 | Thrivikraman et al. | |
| 8,742,453 B2 | | 6/2014 | Chan | |
| 10,411,110 B1 | * | 9/2019 | Verma | ................. H10D 84/401 |
| 10,644,654 B2 | | 5/2020 | Jain et al. | |
| 2019/0081597 A1 | * | 3/2019 | Jain | ........................ H10D 30/60 |
| 2019/0252530 A1 | | 8/2019 | Jain et al. | |

* cited by examiner

*Primary Examiner* — Raj R Gupta
(74) *Attorney, Agent, or Firm* — Francois Pagette; Hoffman Warnick LLC

(57) ABSTRACT

The disclosure provides structures and related methods to provide a source/drain (S/D) terminal within a subcollector. A structure according to the disclosure includes a field effect transistor (FET) structure having a source/drain (S/D) terminal within a semiconductor layer, and a gate structure on the semiconductor layer. A bipolar transistor (BT) structure is on the FET structure and includes a subcollector within the semiconductor layer, and a collector-base-emitter stack on the subcollector and above the semiconductor layer.

20 Claims, 20 Drawing Sheets

STRUCTURE AND RELATED METHOD FOR SOURCE/DRAIN TERMINAL WITHIN SUBCOLLECTOR

BACKGROUND

The present disclosure relates to structures and related methods to provide a source/drain (S/D) terminal within a subcollector.

Present technology is at atomic level scaling of certain micro-devices such as logic gates, bipolar transistors (BJTs, also abbreviated simply as "BT" herein), field effect transistors (FETs), and capacitors. Circuit chips with millions of such devices are common. The structure of a bipolar transistor defines several of its properties during operation. Bipolar transistors typically include multiple materials within its base terminal, i.e., the terminal for controlling current flow between the emitter and collector terminals of the bipolar transistor. A base terminal includes a relatively high conductivity extrinsic base having a terminal thereto, and a relatively low conductivity intrinsic base connected to the extrinsic base and located between the emitter and collector. BTs and FETs may be interconnected to provide a variety of functions in a device. However, certain components for electrically interconnecting certain parts of BTs and FETs (e.g., intermediate contacts and wiring between terminals of different transistors) may impose parasitic losses (e.g., additional capacitance and/or resistance) on a device incorporating these combinations of transistors. These components for interconnecting the transistors also may impose significant area penalties.

SUMMARY

The illustrative aspects of the present disclosure are designed to solve the problems herein described and/or other problems not discussed.

Embodiments of the disclosure provide a structure including: a field effect transistor (FET) structure including: a source/drain (S/D) terminal within a semiconductor layer, and a gate structure on the semiconductor layer; and a bipolar transistor (BT) structure on the FET structure, the BT structure including: a subcollector within the semiconductor layer, and a collector-base-emitter stack on the subcollector and above the semiconductor layer.

Other embodiments of the disclosure provide a structure including: a field effect transistor (FET) structure including: a source/drain (S/D) terminal within a semiconductor layer, and a gate structure on the semiconductor layer; and a bipolar transistor (BT) structure on the FET structure, the BT structure including: a subcollector within the semiconductor layer, wherein the S/D terminal is coextensive with the subcollector, and a collector-base-emitter stack on the subcollector and above the semiconductor layer, wherein the collector-base-emitter stack is horizontally adjacent the gate structure.

Additional embodiments of the disclosure provide a method including: forming a field effect transistor (FET) structure including: a source/drain (S/D) terminal within a semiconductor layer, and a gate structure on the semiconductor layer; and forming a bipolar transistor (BT) structure on the FET structure, the BT structure including: a subcollector within the semiconductor layer, and a collector-base-emitter stack on the subcollector and above the semiconductor layer.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
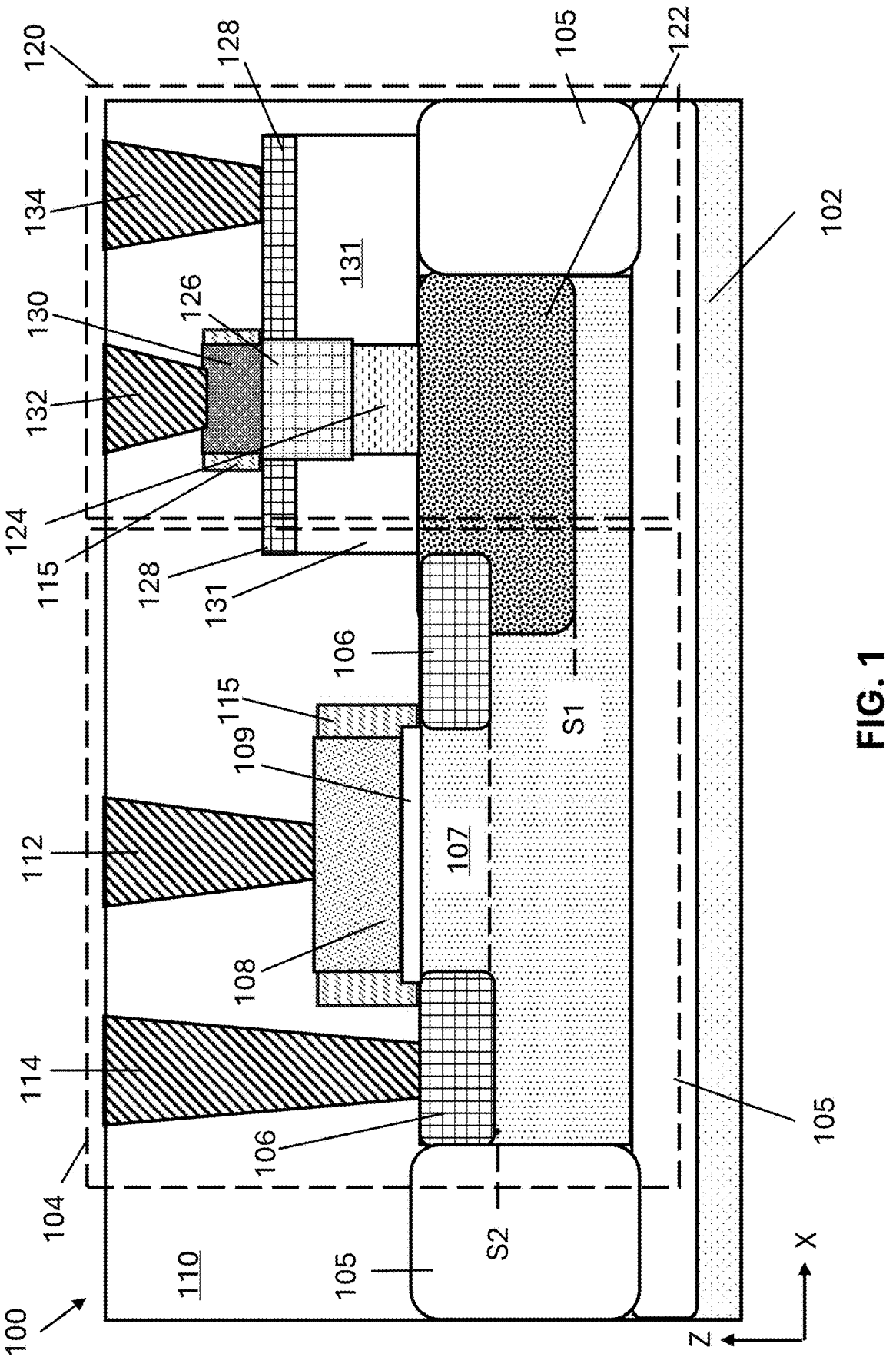
FIG. 1 depicts a cross-sectional view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment"

or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

The disclosure provides structures and related methods to provide a source/drain (S/D) terminal within a subcollector. A structure according to the disclosure includes a field effect transistor (FET) structure having a source/drain (S/D) terminal within a semiconductor layer, and a gate structure on the semiconductor layer. A bipolar transistor (BT) structure is on the FET structure and includes a subcollector within the semiconductor layer, as well as a collector-base-emitter stack on the subcollector and above the semiconductor layer.

Bipolar junction transistor (BJT) structures, such as those in embodiments of the disclosure, operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affects the size of the potential barrier. In the case of a junction between two semiconductor materials, the potential barrier will be formed along the interface between the two semiconductor materials. Generally, a BJT structure includes a base region vertically or horizontally between emitter and collector materials. A BJT can be either a PNP-type BJT or an NPN-type BJT. In a PNP-type BJT, the emitter and collector regions have P-type conductivity and at least a portion of the base region has N-type conductivity. In an NPN-type BJT, the emitter and collector regions have N-type conductivity and at least a portion of the base has P-type conductivity.

The disclosure provides structures and related methods to provide a source/drain (S/D) terminal within a subcollector. A structure according to the disclosure includes a field effect transistor (FET) structure having a source/drain (S/D) terminal within a semiconductor layer, and a gate structure on the semiconductor layer. A bipolar transistor (BT) structure is on the FET structure and includes a subcollector within the semiconductor layer, and a collector-base-emitter stack on the subcollector and above the semiconductor layer. In various implementations, embodiments of the disclosure allow interconnected FET and BT structures (e.g., cascode amplifier circuits) to be formed in close proximity or on top of each other, also reducing resistance and capacitance in such a structure without impeding its operability. A cascode amplifier, in some implementations, may include a circuit in which the source of a field effect transistor (FET) is intercoupled to a collector or emitter of a bipolar transistor (BT) to implement certain amplification functions, e.g., mixing of signals.

Referring to FIG. 1, a structure 100 according to the disclosure may include a substrate 102 with a field effect transistor (FET) structure 104 thereover. Substrate 102 may include but is not limited to: silicon, germanium, silicon germanium, silicon carbide, and those elements consisting essentially of one or more III-V compound semiconductors having a composition defined by the formula $Al_{X1}Ga_{X2}In_{X3}AS_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

Some portions of substrate 102 (located, e.g., adjacent FET structure 104) may include one or more insulator layers 105. Insulator layer(s) 105 can be, for example, an oxide layer, such as a silicon dioxide layer, or a layer of any other suitable insulator material. Insulator layer(s) 105 optionally may take the form of trench isolation layers (TI(s)). In such cases, insulator layer(s) 105 may be made by forming and filling trenches (not labeled) with an insulating material such as oxide. Insulator layer(s) 105 horizontally isolate certain active components and other components thereon (e.g., bipolar transistor and field effect transistor (FET) structures and bipolar transistor (BT) structures provided together as discussed herein) from any adjacent regions of material. Various portions of structure 100, including the active semiconductor materials of FET structure 104 and/or other devices such as BT structure(s) discussed herein, where applicable, may be formed on or above portions of insulator layer 105 that function as TI(s). Two insulator layer 105 in the form of TIs are shown in FIG. 1 as an example, but multiple insulator layers 105 in various forms may be provided, e.g., one insulator layer 105 is shown in FIG. 1 below substrate 102 to provide a buried insulator layer, also known as a buried oxide or "BOX" layer to provide additional forms of insulation. Insulator layer(s) 105 may be formed before various active materials on substrate 102, but this is not necessarily true in all implementations.

Upper portions of substrate 102 may be doped in a desired polarity (e.g., p-type or n-type as discussed herein) to define a set of S/D terminals 106 within substrate 102. S/D terminals 106 in substrate 102 may have the same conductivity type, e.g., p-type doping. A portion of substrate 102 between S/D terminals 106 provides a channel layer 107 within substrate 102, in which channel layer 107 has an opposite doping polarity relative to S/D terminals 106.

Other portions of FET structure 104 may be over S/D terminals 106 and over channel layer 107. FET structure 104 for instance may include a gate conductor 108 and a gate dielectric layer 109 between channel layer 107 and gate conductor 108. Gate dielectric layer 109 may include any thin layer of dielectric material capable of preventing electrical coupling between channel region 107 and gate conductor 108 over gate dielectric layer 109 while allowing electric fields within gate conductor 108 to influence the electrical conductivity within channel layer 107. Gate dielectric layer 109 may include, e.g., a "high-k" dielectric material (i.e., any material having a dielectric constant of at least 3.9) or other currently known or later developed gate dielectric materials, and as examples may include hafnium silicate (HfSiO), hafnium oxide (HfO$_2$), zirconium silicate (ZrSiO$_x$), zirconium oxide (ZrO$_2$), silicon oxide (SiO$_2$), silicon nitride (Si$_3$N$_4$), silicon oxynitride (SiON), or any combination of these materials.

Gate conductor 108 including a conductive metal (e.g., copper, aluminum, and/or other metal wiring materials) and/or an active semiconductor material (e.g., doped polycrystalline Si and/or SiGe) may be over gate dielectric layer 109. In the case where gate conductor 108 includes active semiconductor material, its upper portions optionally may include a silicide material (not shown in FIG. 1) for improving the electrical interface between gate conductor 108 and metal wires and/or vias coupled thereto. Together, gate dielectric layer 109 and gate conductor 108 define a gate of FET structure 104. Electrically active portions of gate conductor 108 may define the gate terminal of FET structure 104. Collectively, gate conductor 108 and gate dielectric layer 109 may define one "gate structure" for FET structure 104.

An inter-level dielectric (ILD) layer 110 may be over substrate 102, and various components may be within ILD layer 110 and over substrate 102, e.g., to electrically couple various parts of FET structure 104 to other components in overlying portions (e.g., metal wiring or back end of line ("BEOL") layers) of a device. ILD layer 110 may include the same insulating material as insulator layer(s) 105 or may include a different electrically insulative material for vertically separating active materials from overlying materials, e.g., various horizontally extending wires or vias. ILD layer 110 and insulator layer(s) 105 nonetheless constitute different components, e.g., due to insulator layer(s) 105 being horizontally between FET structure 104 and other components on substrate 102, and/or in other positions discussed herein. ILD layer 110 may be formed by deposition and/or other techniques to provide electrically insulating materials, and can then be planarized (e.g., using CMP), such that its upper surface remains above substrate 102, FET structure 104, etc.

A gate contact 112 may vertically couple gate conductor 108 to metal wires, vias, and/or other components through ILD 110. Similarly, a source/drain (S/D) contact 114 may vertically couple S/D terminal 106 to other metal wires, vias, and/or other components through ILD 110. One or more of S/D terminals 106 may not have a corresponding S/D contact 114 thereon, e.g., by being directly coupled to and/or simultaneously defining part of a BT structure 120 coupled to FET structure 104. A spacer 115 (e.g., formed of nitride-based insulator materials and/or other types of insulators) also may cover sidewalls of gate conductor 108. Spacers 115 also may be provided elsewhere in structure 100 as discussed herein.

Structure 100 includes BT structure 120 on and within substrate 102. BT structure 120 is also adjacent and electrically coupled to FET structure 104. BT structure 120 may be, e.g., a vertically oriented bipolar transistor, as discussed herein, having a subcollector 122 within substrate 102, a collector 124 on subcollector 122, an intrinsic base 126 and extrinsic base 128 over collector 124, and an emitter 130 on intrinsic base 126. Subcollector 122 (i.e., a doped portion of substrate 102 having a same doping type as S/D terminal(s) 106) may be adjacent to, or in other cases may include and/or be coextensive with, S/D terminal(s) 106 of FET structure 104. The term "coextensive," as discussed herein, refers to two components that occupy the same space and thus are formed of an identical material composition. The component thus may be a single material defining two structural and/or operational functions within structure 100. In the example of FIG. 1, S/D terminal 106 and its adjacent subcollector 122 are not coextensive, but other implementations discussed herein demonstrate how S/D terminal 106 and subcollector 122 may be coextensive.

Subcollector 122 may include, e.g., one or more monocrystalline semiconductor materials. Subcollector 122 may include but is not limited to silicon, germanium, silicon germanium (SiGe), silicon carbide, or any other common IC semiconductor substrates. In the case of SiGe, the germanium concentration in subcollector 122 may differ from other SiGe-based structures described herein. A portion or entirety of subcollector 122 may be strained.

Subcollector 122 may be doped (i.e., it may define a "doped well"), e.g., to enhance electrical coupling to adjacent portion(s) of S/D terminal 106. As shown in FIG. 1, a portion of S/D terminal 106 may be within subcollector 122 where subcollector 122 is larger than S/D terminal 106. In other embodiments, S/D terminal 106 may be larger than subcollector 122 and/or subcollector 122 may be located partially inside S/D terminal 106. Subcollector 122 may have any conceivable doping type and/or doping composition appropriate for use within and/or coupling to the collector terminal of a bipolar transistor. For instance, subcollector 122 may have the same dopant type as S/D terminal 106, and/or collector 124 formed thereon, e.g., P-type doping in the case of a PNP-type BJT or N-type doping in the case of an NPN-type BJT, and/or it may have a higher or lower dopant concentration therein. Subcollector 122 may be horizontally adjacent insulator layer 105, e.g., along a sidewall that is opposite S/D terminal 106 of FET structure 104. In addition, a lower surface S1 of subcollector 122 optionally may be below a lower surface S2 of S/D terminal 106, in which case subcollector 122 may be larger and deeper than S/D terminal(s) 106 to which it connects.

Collector 124 may be on subcollector 122, e.g., layer of silicon, SiGe, and/or other semiconductor materials on subcollector 122, and may have a predetermined doping type, e.g., by being doped in-situ or during formation of collector 124 material on subcollector 122. Collector 124 may have the same doping polarity as subcollector 122, but in a lower dopant concentration than that of subcollector 122. Collector 124 may define active semiconductor material of a vertical bipolar transistor, and thus may be vertically below other terminals (i.e., intrinsic base 126, emitter 130, etc.).

BT structure 120 also includes isolation layer 131, which optionally may be subdivided into multiple layers and/or materials. Isolation layer 131 may be on insulator layer(s) 105, S/D terminal 106, and/or subcollector 122 to enable growth of collector 124 above subcollector 122 and forming of other active semiconductor material(s) thereon. Isolation layer 131 also may help to horizontally separate collector 124 from other active materials (e.g., portions of FET structure 104) located over substrate 102. As discussed elsewhere herein, portions of isolation layer 131 may be removed to form a trench and to expose an upper surface of subcollector 122. Collector 124 may be formed within isolation layer 131 by epitaxial growth and doping of semiconductor material within the trench. Collector 124 may be doped after forming of semiconductor material and may be substantially coplanar with isolation layer 131.

Bipolar transistor 104 may include intrinsic base 126 on collector 124. Intrinsic base 126 may include, e.g., monocrystalline SiGe or any other monocrystalline semiconductor material that is doped to have a predetermined polarity. In various implementations, the collector, emitter, and base of a BJT are made of the same semiconductor material (e.g., silicon). However, when at least a portion of the base is made of a different semiconductor material (e.g., silicon germanium as opposed to silicon) than the collector and the emitter, BT structure 120 takes the form of a heterojunction bipolar transistor (HBT). In the case where BT structure 120 is an NPN-type transistor and subcollector 122 and collector 124 are doped n-type, intrinsic base 126 may be doped p-type to form a P-N junction, and hence a base-to-collector interface. It is also understood that intrinsic base 126 may be doped n-type in the case where the bipolar transistor is a PNP-type transistor. However embodied, intrinsic base 126 may extend to a predetermined height over collector 124 and, as discussed herein, intrinsic base 126 may have sidewalls substantially aligned with those of collector 124 thereunder.

Intrinsic base 126 may be structurally and composition-ally distinct from other portions of a base terminal for BT structure 120. Intrinsic base 126 in particular may be lightly doped, or possibly undoped, whereas other bases (e.g., extrinsic base(s) 128 discussed herein) may be doped more highly than intrinsic base 126. Intrinsic base 126 may be formed, e.g., by forming a layer of semiconductor material, which may be monocrystalline silicon or SiGe as discussed herein, on collector 124. Additional semiconductor material may be formed through selective epitaxial growth and/or similar processes to form additional semiconductor material while preserving the crystallographic orientation and/or composition of the underlying material(s). Selective epi-taxial growth of intrinsic base 126 and extrinsic base 128 may cause base(s) 126, 128 to be on, and cover, upper surfaces of collector 124 and isolation layer 131 thereunder.

BT structure 120 may include extrinsic base(s) 128 on isolation layer 131 and adjacent intrinsic base 126. Extrinsic base(s) 128 each may include a polycrystalline semiconduc-tor (e.g., polycrystalline SiGe) with a relatively high amount of the same doping type as (e.g., more p-type doping than) intrinsic base 126. Extrinsic base(s) 128 may be formed, e.g., by depositing an initial (seed) layer of monocrystalline and/or other semiconductor materials on collector 124 and isolation layer 131. Through selective epitaxial growth, deposition, and/or other processing, extrinsic base(s) 128 can be formed from the initial layer to a desired height. Extrinsic base(s) 128 may have sidewalls that are substan-tially aligned with sidewalls of isolation layer 131 thereun-der. Isolation layer 131, by being located underneath extrin-sic base(s) 128, partially electrically isolates extrinsic base(s) 128 from each other, such that intrinsic base 126 is between extrinsic base(s) 128 over collector 124.

Emitter 130 may be on intrinsic base 126. As shown, emitter 130 may be formed on intrinsic base 126, for example, by epitaxial growth and doping of additional semiconductor material(s) on intrinsic base 126. Emitter 130 may have the same doping type as subcollector 122 and collector 124, and thus, has an opposite doping type relative to intrinsic base 126. In the case where BT structure 120 is an NPN device, collector 124 and emitter 130 may be doped n-type to provide the two n-type active semiconductor materials, and intrinsic base 126 and extrinsic base(s) 128 may be doped p-type. Emitter 130 may include monocrys-talline silicon and/or other monocrystalline semiconductor materials, including one or more materials used elsewhere in structure 100 to form subcollector 122, collector 124, base(s) 126, 128, etc.

A spacer 115 may also be adjacent emitter 130 to struc-turally and electrically separate emitter 130 and extrinsic base(s) 128, and/or contacts formed thereto. Spacer 115 may have different compositions to control (e.g., increase) the electrical insulation between emitter 130 and nearby por-tions of extrinsic base(s) 128. For instance, spacer 115 may be an oxide based insulator formed alongside emitter 130. Optionally, additional layers of spacer 115 material may be formed to provide a particular arrangement of insulative materials between extrinsic base(s) 128 and emitter 130. Other compositions and/or arrangements of spacer 115 cur-rently known or later developed also may be used. Spacer(s) 115 thus may include oxide materials, nitride materials, and/or any other insulative material discussed herein, e.g., compositions similar to insulator layer 105 or other insulat-ing structures. Spacer(s) 115 be formed, e.g., by depositing layers of spacer material such that each covers any exposed surfaces of a targeted component (e.g., emitter 130, gate conductor 108 of FET structure 104, etc.). In various imple-mentations, spacer(s) 115 may include a single layer or more than two layers. Spacer(s) 115 adjacent emitter 130 may be formed in different stages of processing from any spacer(s) 115 of FET structure 104, and in some cases may have a different material composition.

Figure 2:
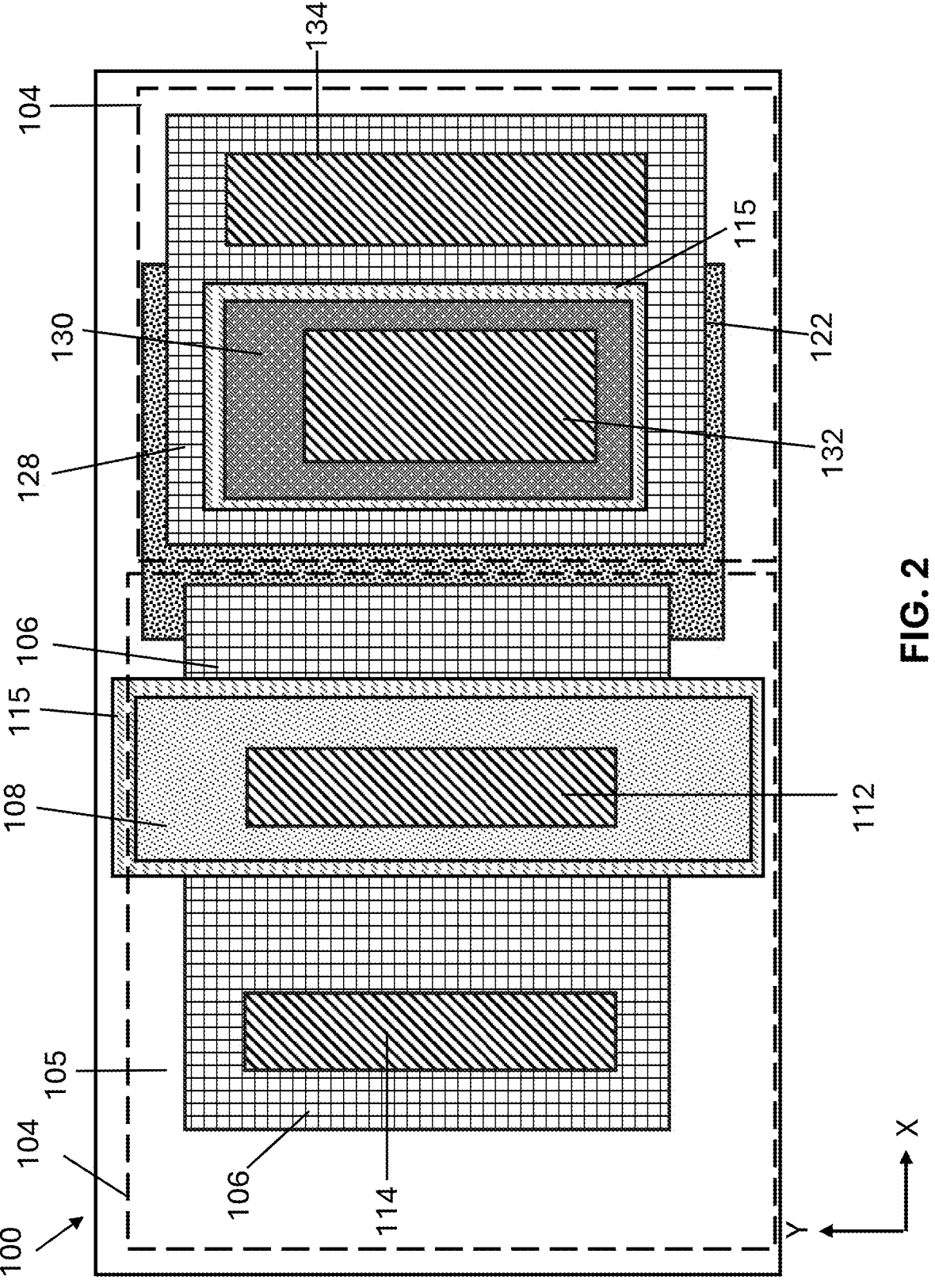
FIG. 2 depicts a plan view of a structure according to embodiments of the disclosure.

Referring to FIGS. 1 and 2 together, with FIG. 2 providing a plan view of structure 100 in plane X-Y, BT structure 120 also may include an emitter contact 132 and a base contact 134. Each contact 132, 134 electrically couple emitter 130 and extrinsic base 128, respectively, of BT structure 120 to overlying metal wires and/or vias. Notably, subcollector 122 may not have a contact thereto and may only be coupled between S/D terminal 106 of FET structure 104 and collec-tor 124. Thus, subcollector 122 interlinks structures 104, 120 during operation but may not have dedicated conductive pathways to overlying metal wires and/or vias. Contact(s) 112, 114, 132, 134 optionally may be formed as part of a single operation, e.g., by removing portions of ILD layer 110 to form openings, optionally forming silicide layers (dis-cussed elsewhere herein) on semiconductor materials exposed within the openings, and filling the openings with metal to define each contact 112, 114, 132, 134. One or more of contacts 112, 114, 132, 134 may include refractory metal liners (not separately shown) on their sidewalls to impede or prevent electromigration degradation, shorting to other com-ponents, etc. As shown, structure 100 may include four contacts 112, 114, 132, 134 and thus may include only one contact 114 to S/D terminal 106 and only one contact 134 to emitter 130, with no contacts being specifically provided for subcollector 122 and/or subcollector 122 (FIG. 1). Other arrangements of structure 100 are possible as discussed herein.

Figure 3:
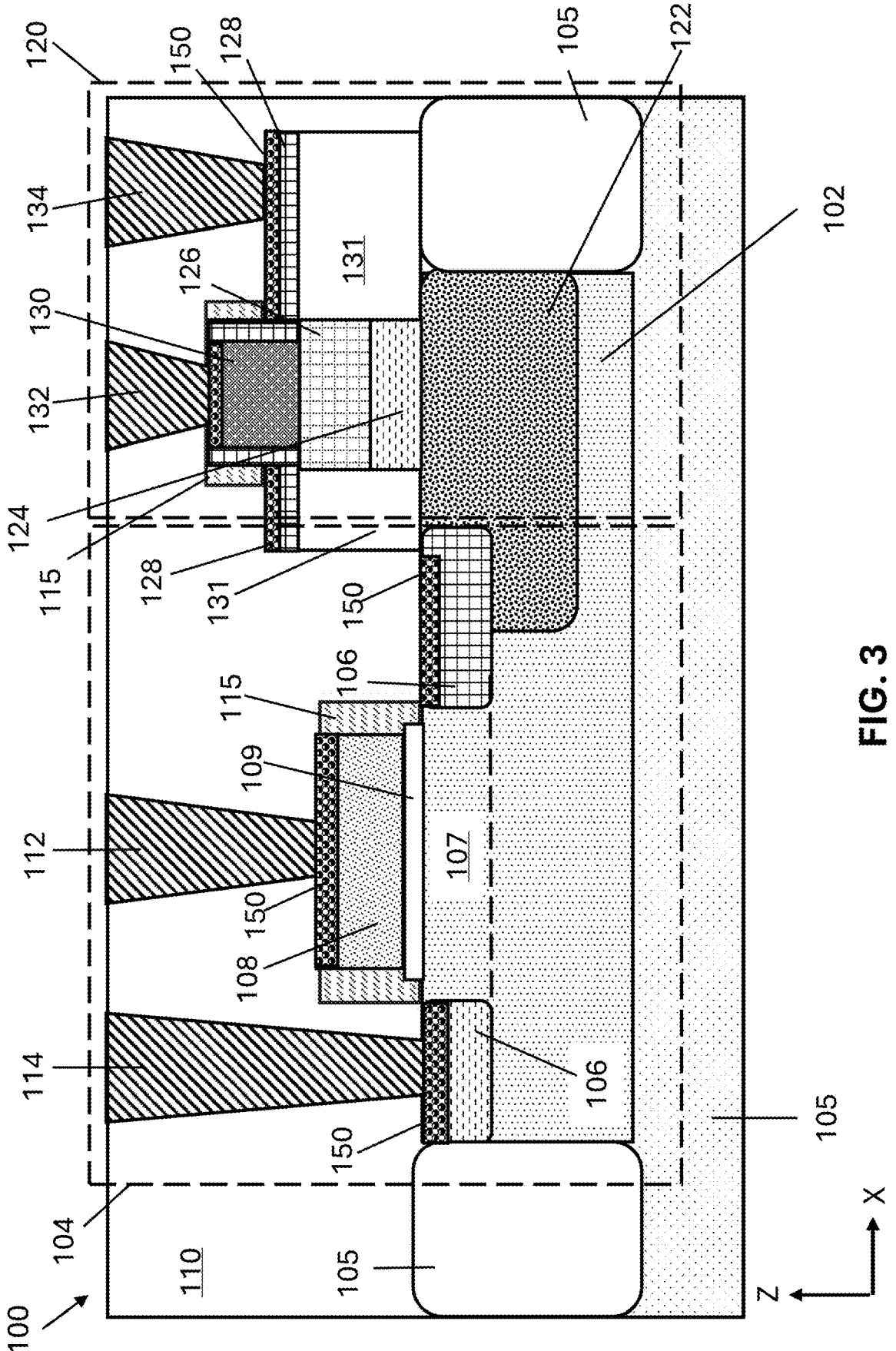
FIG. 3 depicts a cross-sectional view of a structure according to further embodiments of the disclosure.

Referring to FIG. 3, portions of some active semiconduc-tor materials (e.g., S/D terminal(s) 106, gate conductor 108, extrinsic base 128, emitter 130) may be converted into a silicide layer 150 to improve conductivity between each contact 112, 114, 132, 134 and the semiconductor materials thereunder, e.g., by providing a conductive metal alloy including silicon and, for example, cobalt (Co), titanium (Ti), nickel (Ni), platinum (Pt), or similar material on the upper surface(s) of a targeted material. The conductive material(s) may be annealed while in contact with the underlying semiconductor to produce silicide layer 150 for electrically coupling semiconductor materials to any con-tacts, 112, 114, 132, 134 formed thereon. Excess conductive material can then be removed using any now known or later developed solution, e.g., etching, chemical mechanical pla-narization (CMP), etc., where applicable. Silicide layer(s)

150 also may be formed in locations without contact(s) 112, 114, 132, 134 thereto. For instance, silicide layer(s) 150 may be formed as the interface between S/D terminal 106 and subcollector 122 simultaneously with, or otherwise similarly to, other silicide layers 150 before ILD 110 is formed. Silicide layer 150 may be partially within S/D terminal 106 and partially within subcollector 122. Silicide layer(s) 150 may traverse the boundary between S/D terminal 106 and subcollector 122, e.g., to provide a more highly conductive pathway from FET structure 104 to BT structure 120. Silicide layer(s) 150 from S/D terminal 106 to subcollector 122, moreover, may provide an electrical short to reduce electrical resistance along the pathway from S/D terminal 106 to collector 124 through subcollector 122.

Figure 4:
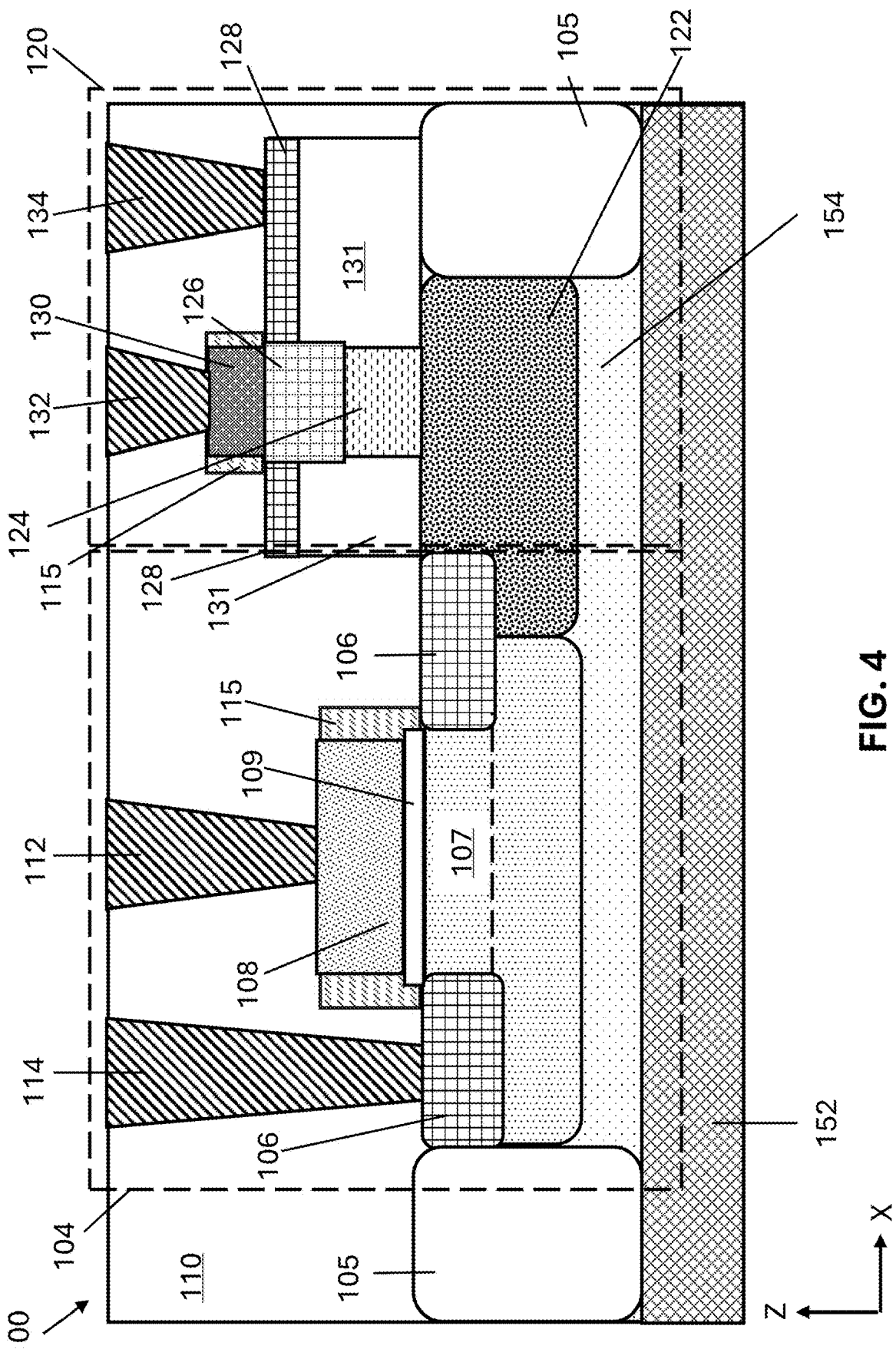
FIG. 4 depicts a cross-sectional view of a structure according to still further embodiments of the disclosure.

Turning to FIG. 4, further implementations of structure 100 may provide FET structure 104 and BT structure 120 in a triple well configuration. A triple well configuration refers to substrate configurations featuring multiple doped wells within a substrate, instead of a deep well, with various shallow wells inside of a particular doped well. These wells may have p-type and n-type doping, e.g., to provide opposite polarity FETs (e.g., multiple FET structure 104 of varying polarity) in close proximity within a device layer. As shown in FIG. 4, structure 100 may include a doped well 152 (e.g., p-type or n-type doped semiconductor) in a particular concentration beneath S/D terminals 106 and channel region 107. Doped well 152 may have the same doping type as channel region 107 and/or subcollector 122 in various embodiments. A shallow well 154 may be on doped well 152 and may have the opposite doping type from doped well 152 thereunder as well as channel region 107 and/or subcollector 122 thereover. Thus, doped well 152, shallow well 154, and any components formed thereover form three regions of alternating polarity to define a triple well structure. Adjacent portions of a device (e.g., those separated from structure 100 by insulator layers 105 in the form of STIs) may have different polarities from structure 100, e.g., by optionally omitting shallow well 154 where desired. Silicide layers 150 (FIG. 3) are omitted from FIG. 4 solely for clarity of illustration but also may be included.

Figure 5:
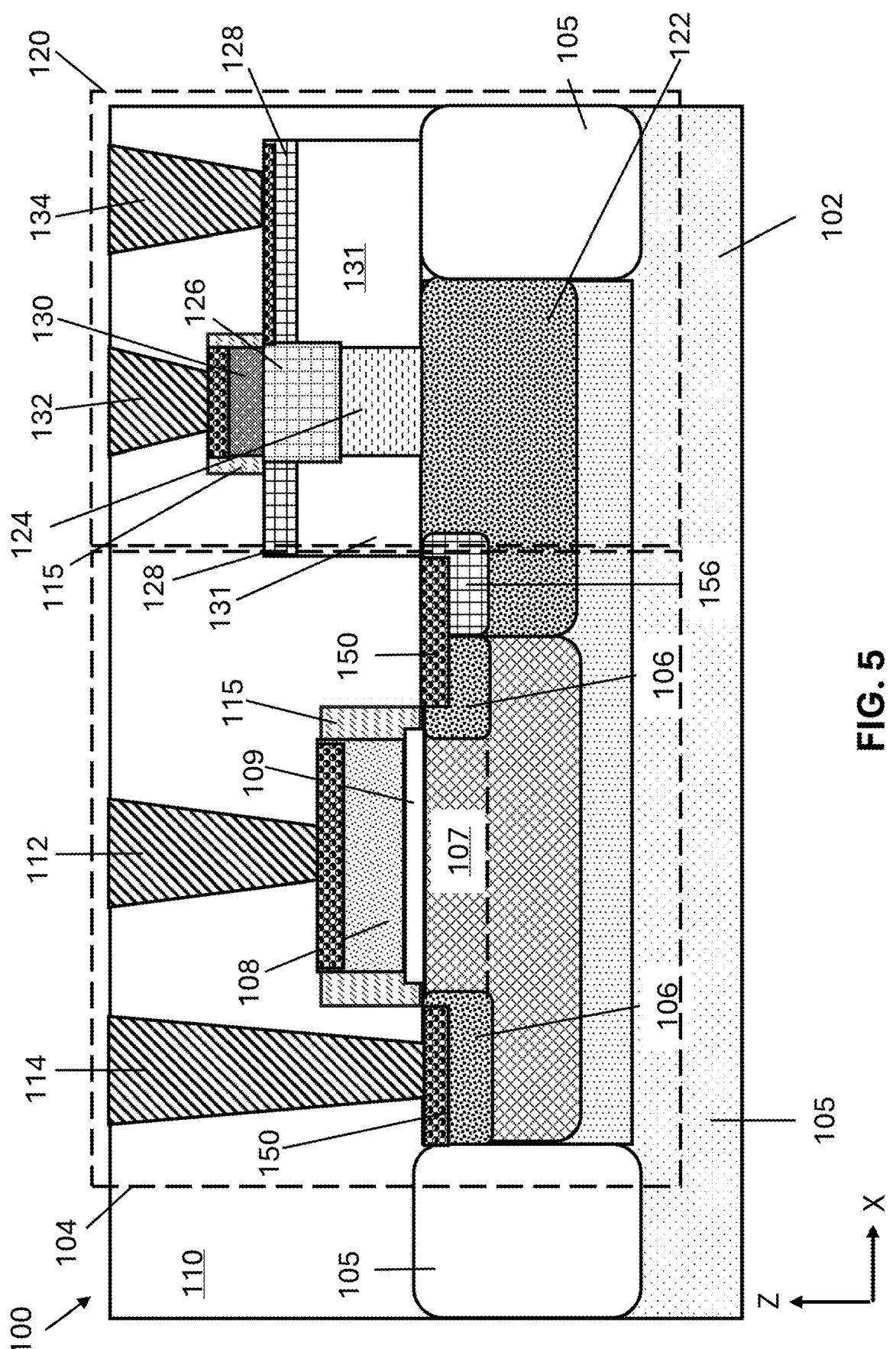
FIG. 5 depicts a cross-sectional view of a structure according to additional embodiments of the disclosure.

FIG. 5 illustrates further configurations of structure 100 in which FET structure 104 has a different doping polarity from other implementations discussed herein. In other embodiments of structure 100 discussed herein, FET structure 104 is illustrated as being in the form of a PFET, and thus S/D terminal 106 may be doped p-type to correspond to the n-type doping of subcollector 122. Structure 100 is operable for use with other transistor polarities, including implementations where the doping type of S/D terminal 106 does not match that of subcollector 122. In this case, subcollector 122 may include a transitional S/D terminal 156 adjacent one S/D terminal 106 and having an opposite doping type. To improve conductivity between S/D terminals 106, 156, one silicide layer 150 may be formed within the upper surface of each terminal 106, 156 to provide a conductive pathway between the two doped semiconductor materials despite their different doping polarities. Although additional S/D terminal 156 is within subcollector 122, it may be laterally adjacent and in physical contact with S/D terminal 106 of FET structure 104 along its sidewalls. The presence of additional S/D terminal 156 may allow BT structure(s) 120 having a different polarity from that of FET structure 104 (i.e., where BT structure 120 is an NPN bipolar transistor but FET structure 104 is a PFET) to be provided together in structure 100 with few changes, e.g., creating additional S/D terminal 156 but not necessarily additional contact(s) thereto. In all other respects, structure 100 with additional S/D terminal 156 may be similar or identical to other implementations discussed herein.

Figure 6:
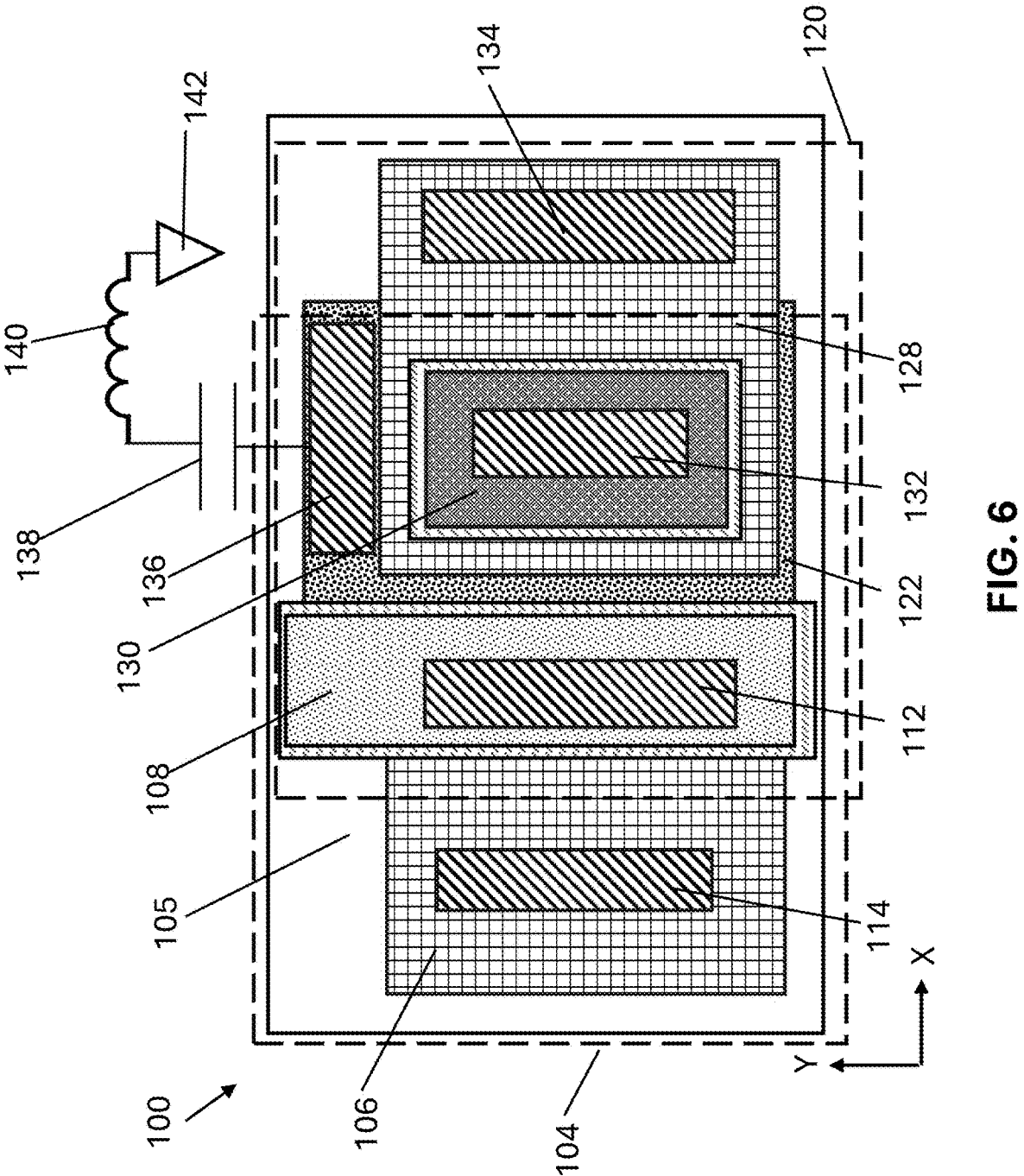
FIG. 6 depicts a plan view of a structure coupled to shunt components according to embodiments of the disclosure.

FIG. 6 depicts a plan view of a further implementation of structure 100, with an optional additional contact to the interconnected S/D terminal 106 and subcollector 122. Although subcollector 122 need not include a conductive contact thereto, various implementations of structure 100 may include such a contact and additional components for further control of FET structure 104 and/or BT structure 120. For example, to account for possible overcurrent during operation of structure 100, a collector contact 136 may be on subcollector 122 (e.g., out of plane with other contacts 112, 114, 132, 134) for coupling subcollector 122 with a shunt capacitor 138, inductor 140, and external coupling 142. Shunt capacitor 138 and inductor 140, may have a sufficient impedance to prevent any electrical current from passing therethrough during non-overcurrent situations within structure 100. To prevent excessive currents from negatively affecting structure(s) 104, 120, shunt capacitor 138 and inductor 140 together may allow excess currents to bypass either or both of structures 104, 120 during operation and pass to other components (e.g., ground and/or other circuitry) via external coupling 142. In such cases, structure 100 may operate substantially as though collector contact 136, shunt capacitor 138, and inductor 140 are not present when overcurrent events are not occurring. Structure 100 also may include a different arrangement of components coupled to subcollector 122, e.g., in any situation where it may be desirable to couple external components to S/D terminal 106 of FET structure 104 and collector 124 of BT structure 120 through subcollector 122.

Figure 7:
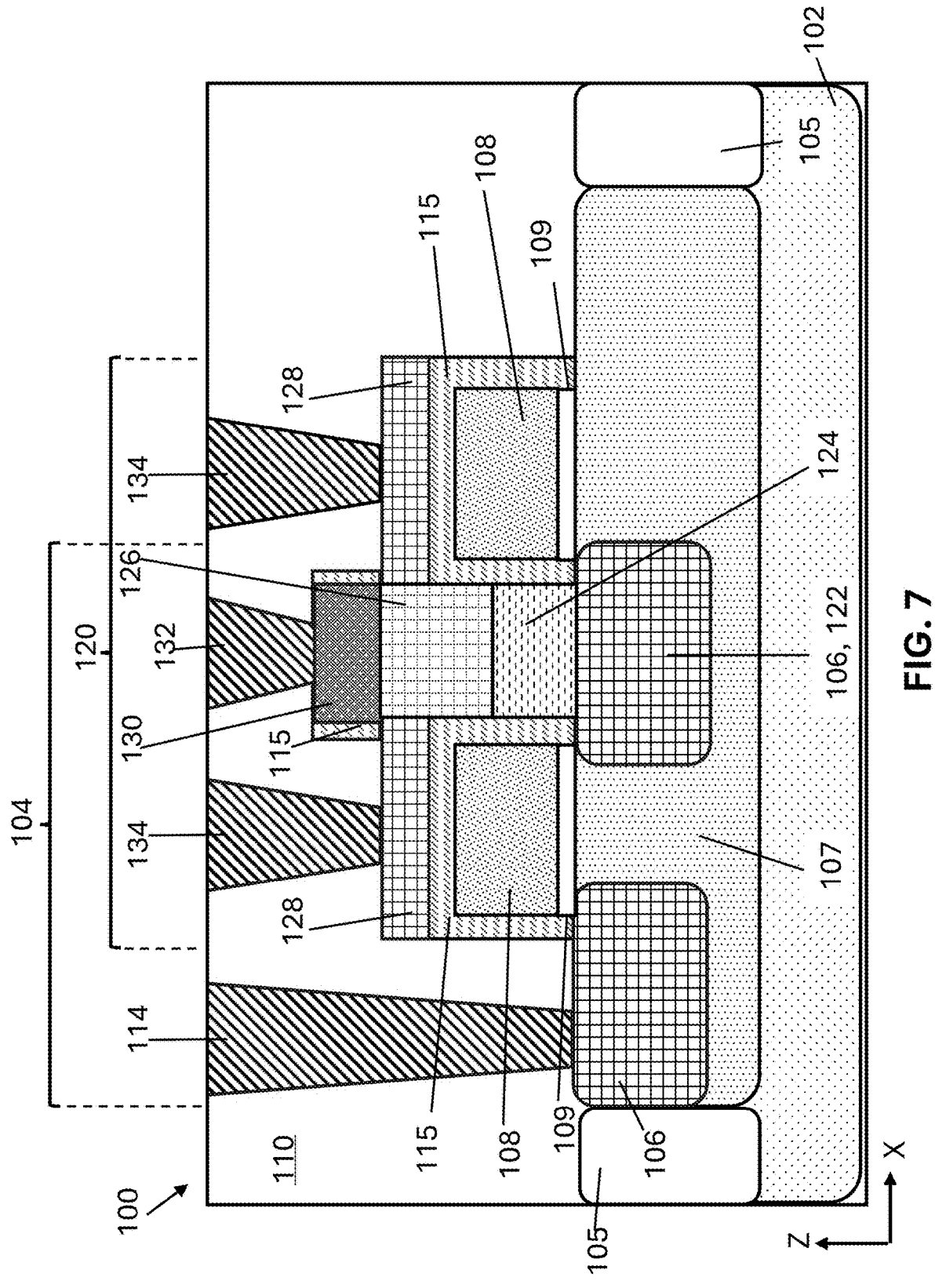
FIG. 7 depicts a cross-sectional view of a structure with a subcollector coextensive with an S/D terminal according to embodiments of the disclosure.

Turning to FIG. 7, further implementations of structure 100 may allow S/D terminal 106 to be coextensive with subcollector 122 (i.e., they may co-occupy one region of doped semiconductor material). Substrate 102, insulator layer 105 (e.g., STIs), and channel region 107 may be provided substantially as described and shown elsewhere herein, with ILD 110 being over S/D terminal 106 and S/D contact 114 extending vertically therethrough. In the implementation of FIG. 6, subcollector 122 is within channel region 107 and coextensive with another S/D terminal 106. The term "coextensive," as defined previously herein, refers to two components that occupy the same space and thus are formed of an identical material composition. Thus, S/D terminal 106 and subcollector 122 may be within a single region of doped semiconductor region having a uniform doping polarity and concentration (e.g., they may be coextensive within n-type semiconductor material). The coextensive S/D terminal 106 and subcollector 122 may have a similar or identical doping profile (i.e., doping polarity and concentration) as another S/D terminal 106 in structure 100 that is not coextensive with a different subcollector 122. Thus, S/D terminals 106 in structure 100 may be indistinguishable from each other regardless of whether they also function as subcollector 122 during operation of structure(s) 104, 120.

Figure 9:
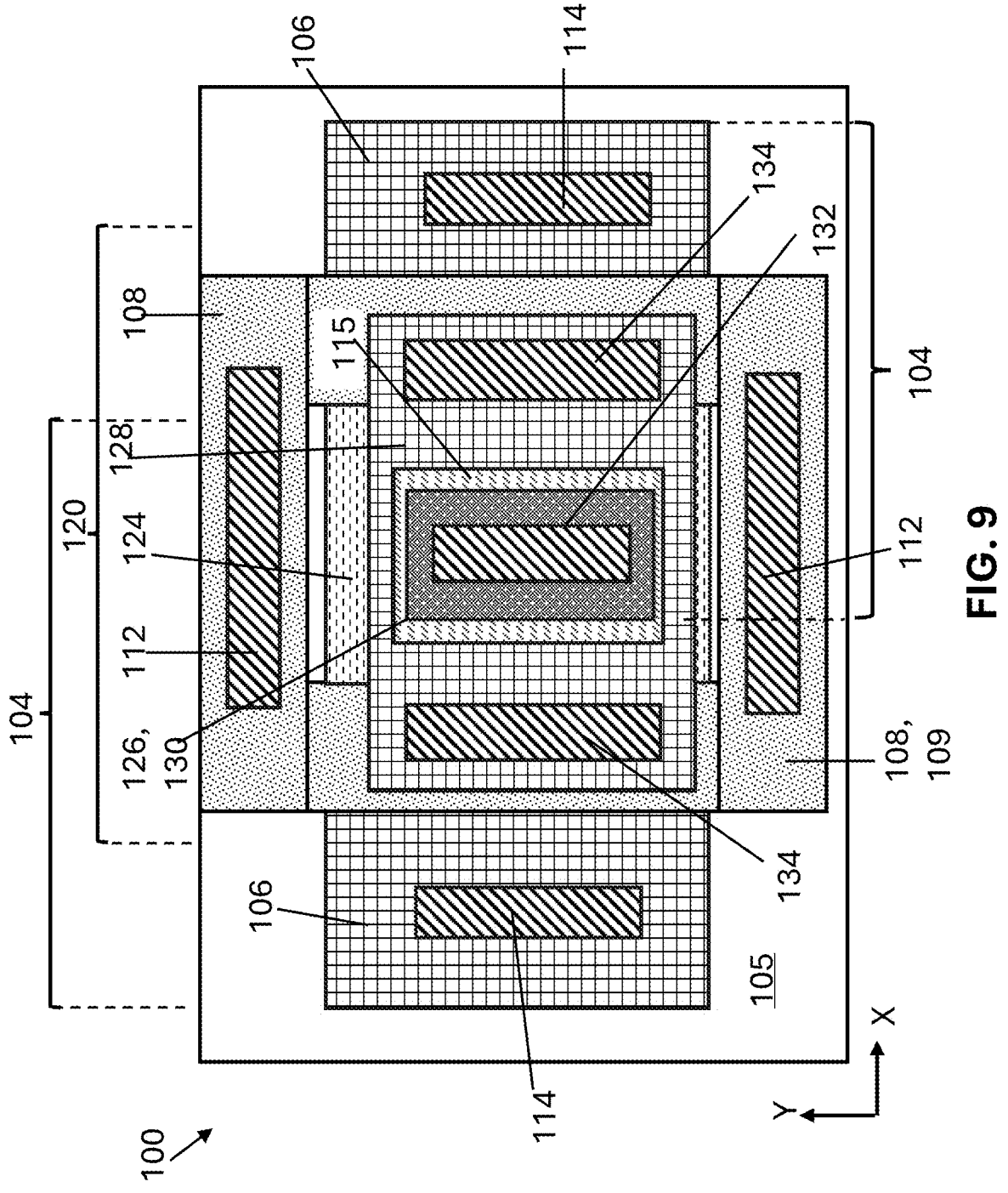
FIG. 9 depicts a plan view of a structure with a subcollector coextensive with an S/D terminal according to further embodiments of the disclosure.

For the coextensive S/D terminal 106 and subcollector 122 to operate, gate conductor 108 may be over channel region 107 between S/D terminal 106 and may be surrounded by gate dielectric layer(s) 109, e.g., including gate dielectric layers and gate spacers. One or more conductive contacts to gate conductor 108 may be located outside the plane (i.e., in front of or behind the plane of the page) to enable application of voltages to gate conductor 108. Such an arrangement is shown in FIG. 9 and discussed elsewhere. Gate dielectric layer 109 may electrically insulate gate conductor 108 from various active semiconductor materials in BT structure 120, e.g., due to the larger doping concentrations of components within BT structure 120. Spacers 115 of varying thickness from gate dielectric 109 also may be on the upper surface and sidewalls of gate conductor 108 to further insulate gate conductor 108 from BT structure 120.

In this configuration, gate conductor 108 and gate dielectric layer 109 serve the same purposes of insulator layer 105 (FIGS. 1, 3-5) during operation. Collector 124 may be formed by epitaxial growth of semiconductor material on the coextensive S/D terminal 106 and subcollector 122, then planarized such that the upper surface of collector 124 is substantially coplanar with gate dielectric layer(s) 109. Intrinsic base 126 and extrinsic base(s) 128 can then be formed on collector 124 and gate dielectric layer(s) 109 in substantially the same shape and configuration as other embodiments. Emitter 130 and contacts 132, 134 then can be formed over base(s) 126, 128 to provide the remaining portions of BT structure 120.

Figure 8:
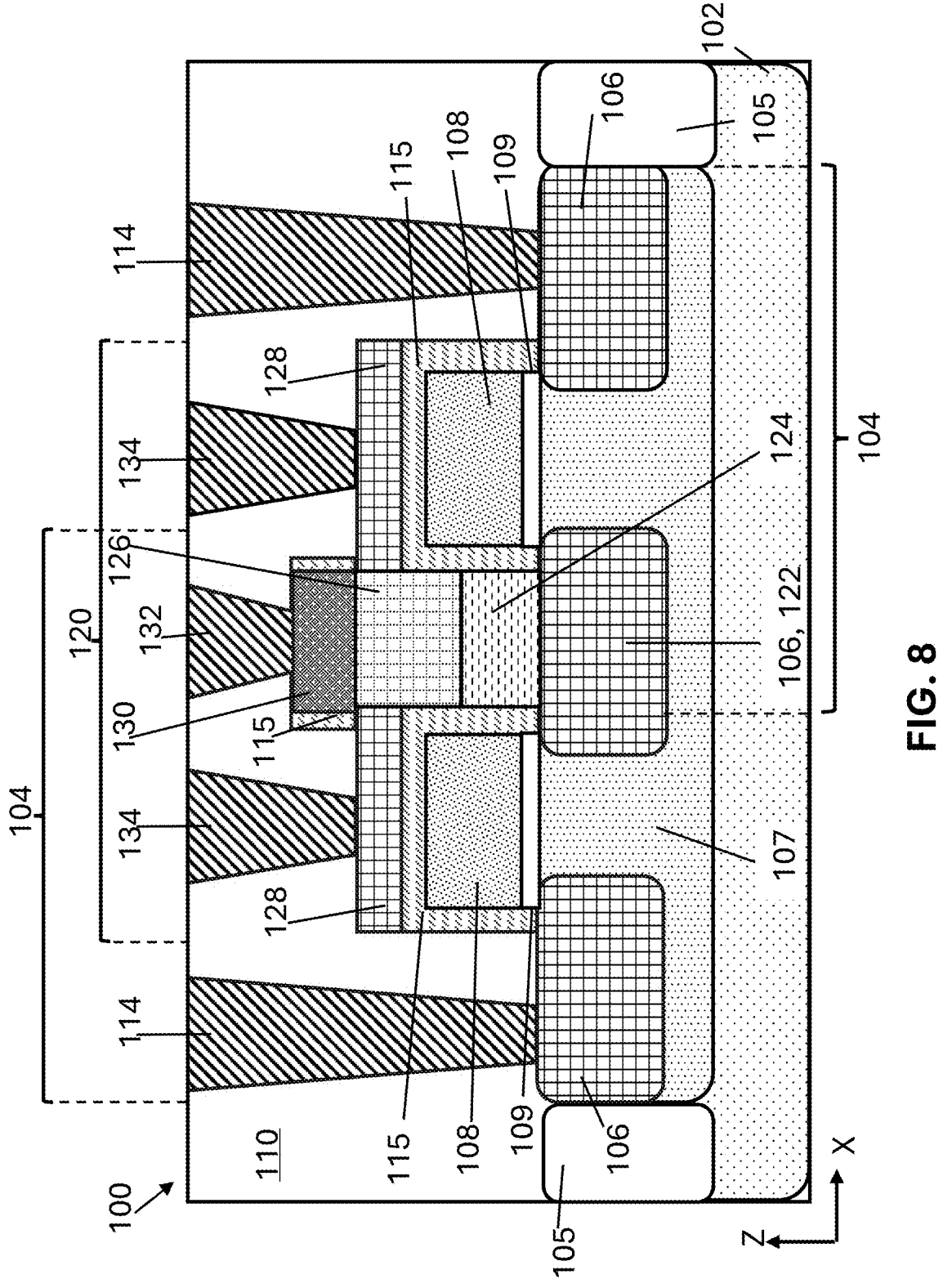
FIG. 8 depicts a cross-sectional view of a structure with a subcollector coextensive with an S/D terminal according to further embodiments of the disclosure.

Referring to FIGS. 8 and 9, where FIG. 8 provides a cross-sectional view in plane X-Z and FIG. 9 provides a plan view in plane X-Y, further implementations of structure 100 may enable two FET structures 104 to be provided in the case where one S/D terminal 106 is coextensive with subcollector 122 (FIG. 7 only). Here, two gate conductors 108 and gate dielectric layer(s) 109 may be formed over channel region 107, with the coextensive S/D terminal 106 and subcollector 122 located between gate conductors 108. Two additional S/D terminals 106 (which may not be coextensive with other subcollectors 122) may be over substrate 102 such that each gate conductor 108 is horizontally between two S/D terminals 106. In this arrangement, BT structure 120 may be horizontally between, and coupled to, two FET structures 104. As shown specifically in FIG. 9, gate conductor 108 and gate dielectric layer 109 may surround collector 124, and also may be located under bases 126, 128. Portions of gate conductor 108 located away from FET structure(s) 104 (e.g., along the Y axis as shown) may have gate contacts 112 thereon, such that structure 100 includes contacts 112, 114, 132, 134 discussed herein despite one S/D terminal 106 being coextensive with subcollector 122.

FIG. 10-16 depict various phases of an example method to form structure 100 according to different embodiments. The various examples of processing shown and described herein are provided relative to the example implementation shown in FIGS. 8 and 9, but it is understood that any implementation of structure 100 may be formed using methods of the disclosure by modifications within the skill of one having ordinary skill in the art, or by further modifications herein described.

Figure 10:
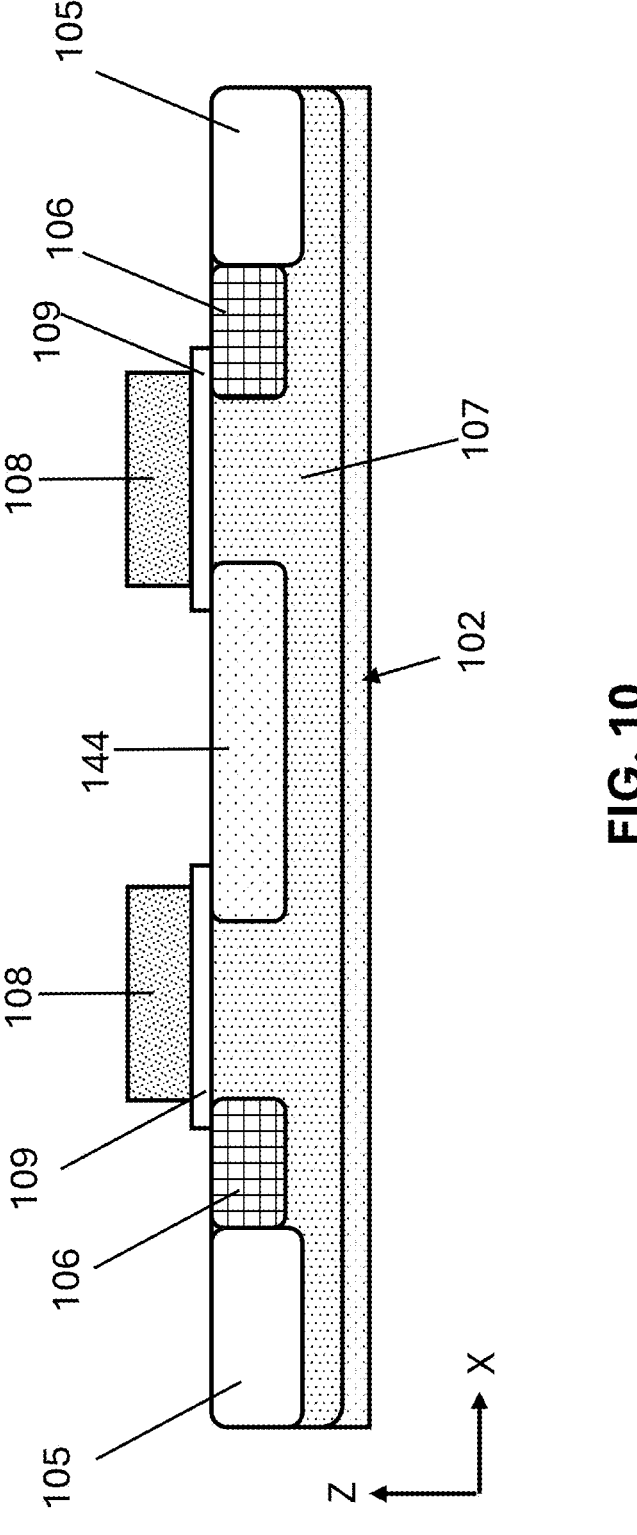
FIGS. 10-16 depict cross-sectional views of processes in methods to form a structure according to embodiments of the disclosure.

FIG. 10 depicts the result of various initial phases of processing, where one or more S/D terminals 106 and/or channel region(s) 107 are formed by initial doping of substrate 102 in desired locations and/or to predetermined concentrations with desired polarities. Substrate 102 also may include, e.g., a subcollector site 144 having the same doping type and/or concentration as channel region(s) 107 adjacent thereto or having a different doping profile. In some cases, subcollector site 144 may be free of doping apart from any pre-doping of substrate 102. Gate conductor 108 and gate dielectric layers 109 also may be on channel regions 107, e.g., by way of deposition and etching to form gate structures substantially in accordance with conventional FET processing techniques. Insulator layers 105 (e.g., TIs as discussed herein) also may be on or within substrate 102. Optionally, gate conductor(s) 108 initially may be in the form of a single contiguous gate conductor covering subcollector site 144.

Figure 11:
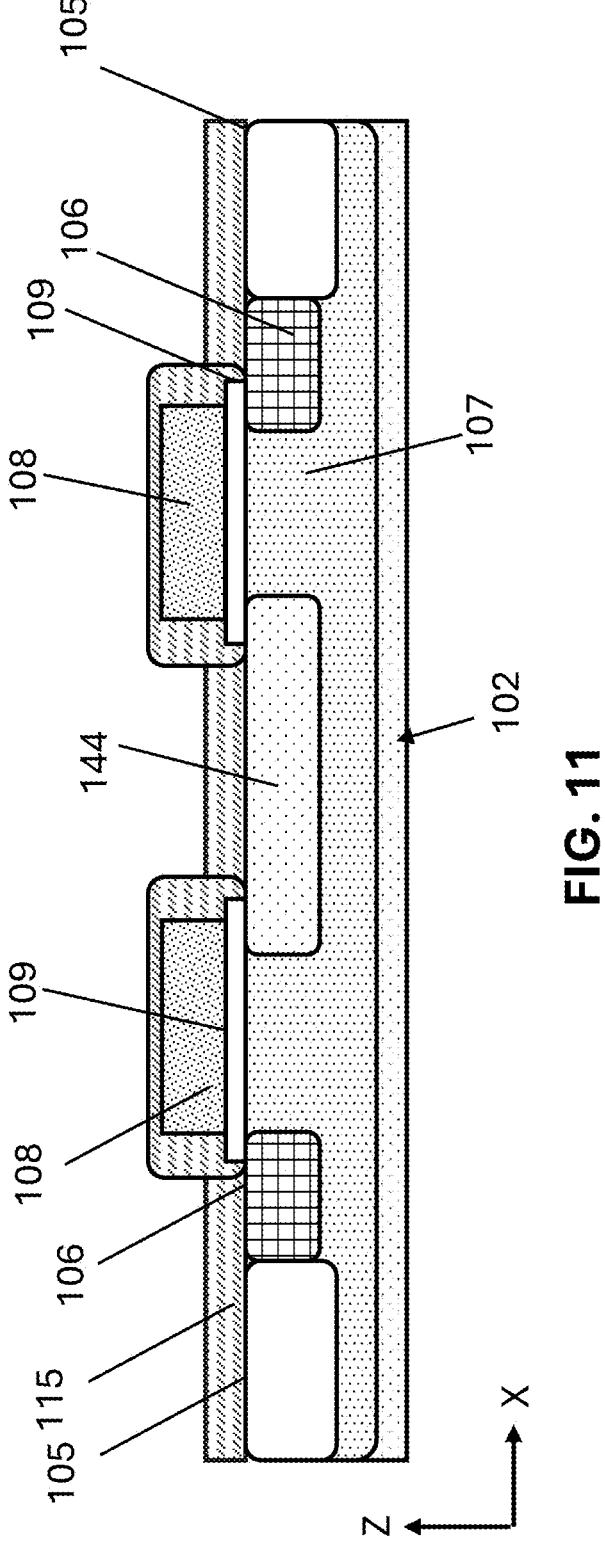

FIG. 11 depicts further processing by forming additional insulator layer 105 material (e.g., additional dielectric materials) to cover any previously formed insulator layer 105, as well as upper surfaces and sidewalls of gate conductor 108 and subcollector site 144 along its upper surface. Insulator layer 105 may be formed by non-conformal or conformal deposition and/or other processes suitable to form dielectric materials. Additionally, insulator layer 105 may include the same or similar materials to spacer(s) 115 discussed elsewhere herein.

Figure 12:
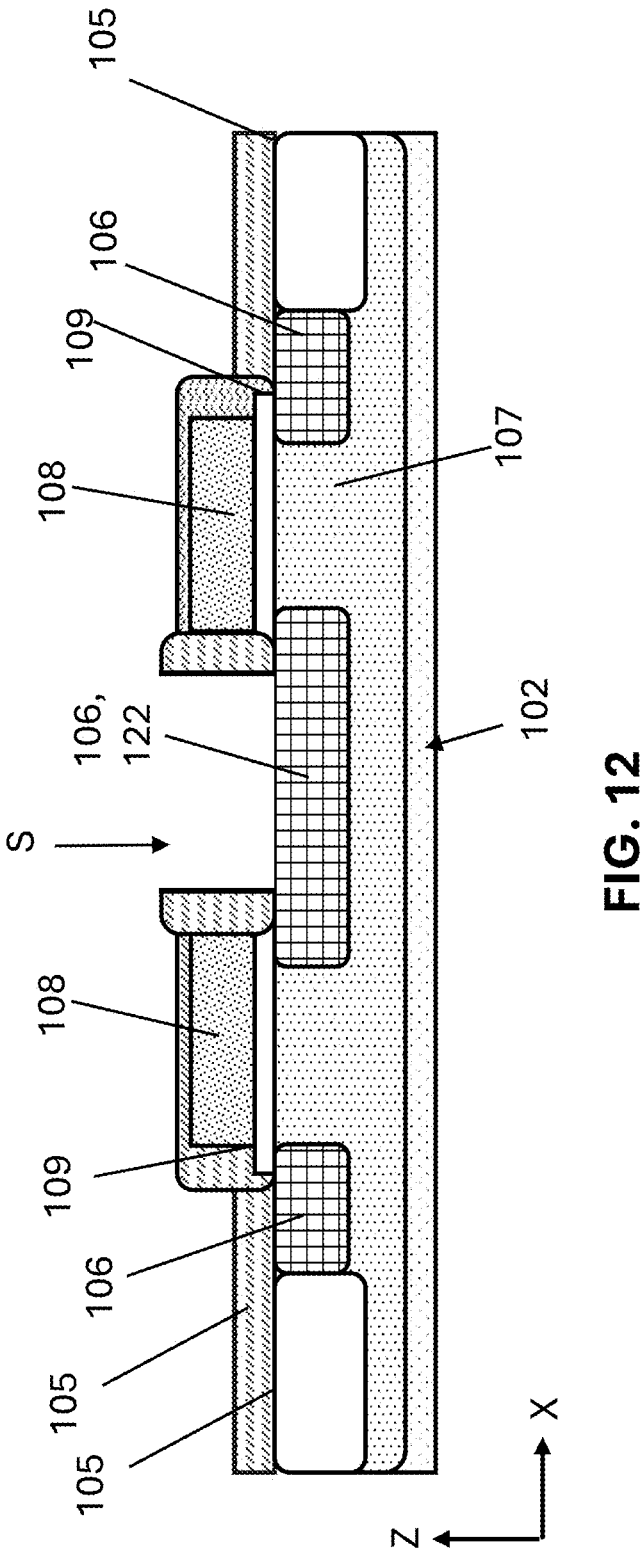

FIG. 12 depicts removing a portion of insulator layer 105 and doping of subcollector site 144 (FIGS. 10 and 11) to form S/D terminal 106 and subcollector 122 within substrate 102 (e.g., as a single region of semiconductor material in which S/D terminal 106 and subcollector 122 are coextensive). The removing of insulator layer 105 over subcollector site 144 may include, e.g., covering other portions of the structure with a temporary mask (not shown), removing portions of insulator layer 105 not covered by the temporary mask (e.g., by etching and/or other removal techniques), and thereafter removing the temporary mask. The partial removing insulator layer 105 may create an opening S horizontally adjacent or between gate conductors 108. Directional etching and/or similar techniques to remove insulator layer 105 may prevent gate dielectric layer 109 from being removed from the sidewalls of gate conductors 108. The doping of subcollector site to form S/D terminal 106 and subcollector 122 therein may include, e.g., implantation and/or other techniques to dope a semiconductor material. The continued presence of gate dielectric layer 109 elsewhere on the structure may enable only subcollector site 144 to be doped.

Figure 13:
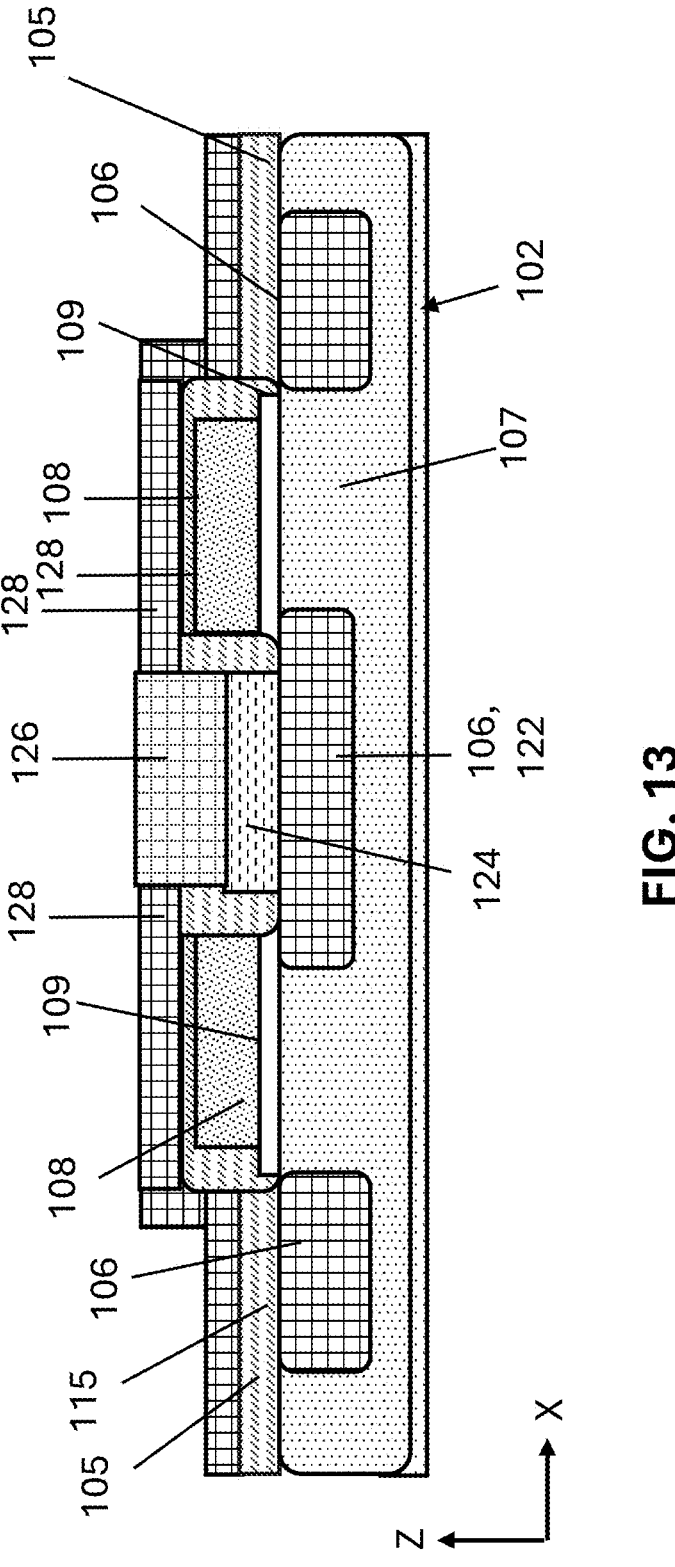

FIG. 13 depicts forming collector 124 within opening S. The forming of collector 124 may include, e.g., deposition and doping of semiconductor materials on S/D terminal 106 and subcollector 122. Collector 124 may have a particular conductivity type depending on whether a PNP bipolar transistor or NPN bipolar transistor. FIG. 13 also depicts forming intrinsic base 126 on collector 124 and extrinsic base 128 elsewhere over gate dielectric layers 109. The forming of intrinsic base 126 may be part of the same process to form collector 124, e.g., it may include continued epitaxial growth of semiconductor material but doping the additional material to have an opposite doping polarity from collector 124 on collector 124 and epitaxially growing additional semiconductor material on the seed layer. Extrinsic base 128 may be formed on insulator layer 105 in a similar manner. Intrinsic base 126, as discussed herein, may have a lower doping concentration than extrinsic base 128. The differences in doping may arise, e.g., by epitaxially growing a more conductive material to form extrinsic base 128 than is used to form intrinsic base 126, by additionally doping semiconductor material to form extrinsic base 128 while covering intrinsic base 126 with a temporary mask (not shown), and/or by implementing other currently known or later developed techniques to form bases 126, 128 with varying dopant concentrations.

Figure 14:
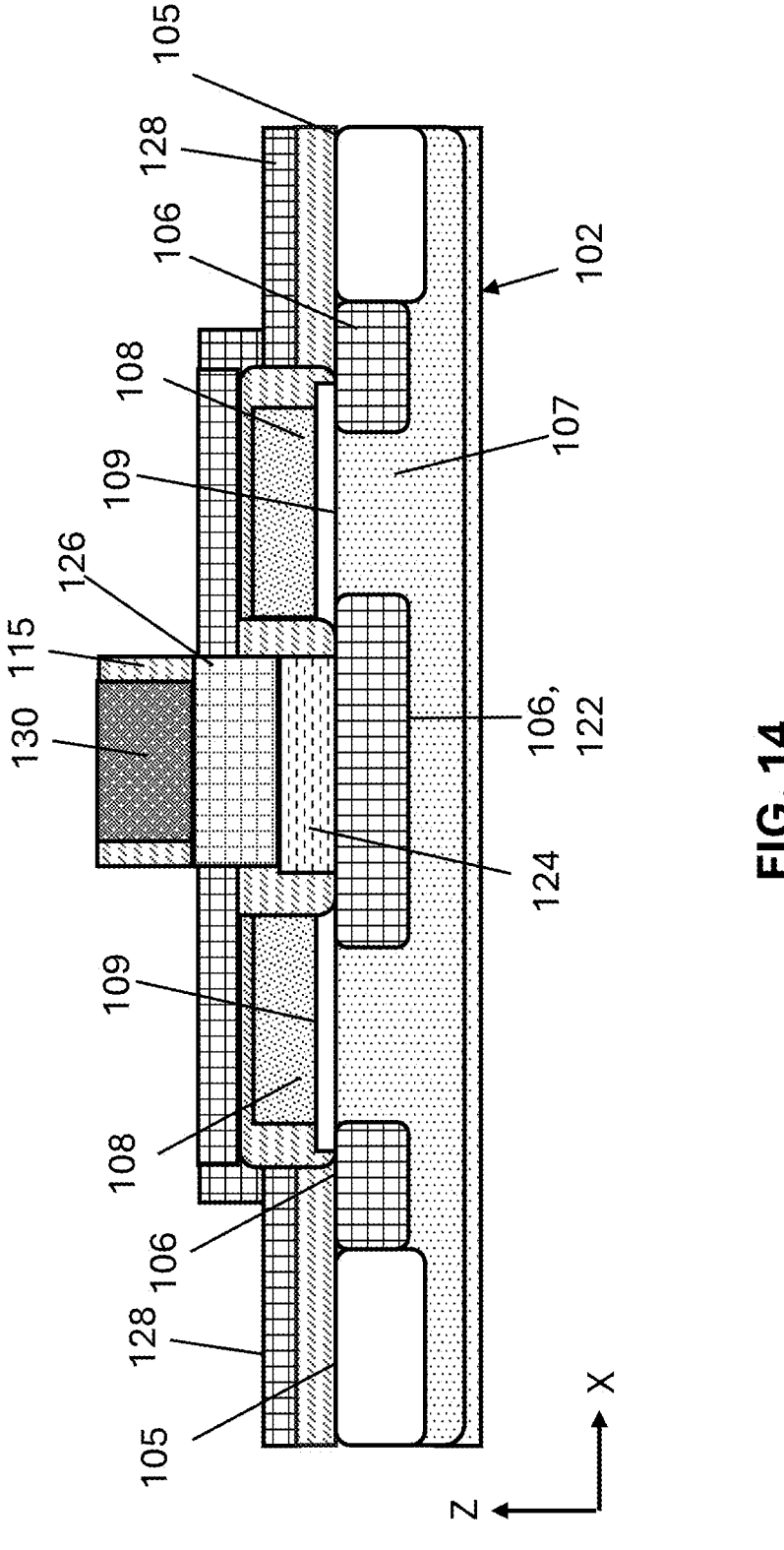

FIG. 14 depicts further processing, e.g., by depositing spacer 115 material over the structure, forming an opening within the spacer material to permit deposition and/or growth of emitter 130 material therein, and subsequently removing spacer 115 material such that it remains intact only on the sidewalls of emitter 130. The forming of emitter 130 may be by additional doping and/or deposition of semiconductor materials having an opposite polarity from that of bases 126, 128. Emitter 130 generally may be formed by application of any currently known or later developed techniques to form semiconductor material in targeted locations.

The removing of spacer 115 material where initially present over extrinsic base 128 may be implemented, e.g., by forming a temporary polysilicon removal mask (not shown) on emitter 130 and removing the temporary mask after spacer 115 is removed elsewhere. Such a mask is for processing of emitter 130, and not required for forming of spacer 115. These removing operations may be performed, e.g., by vertical etching and/or other appropriate removal techniques for spacer material.

Figure 15:
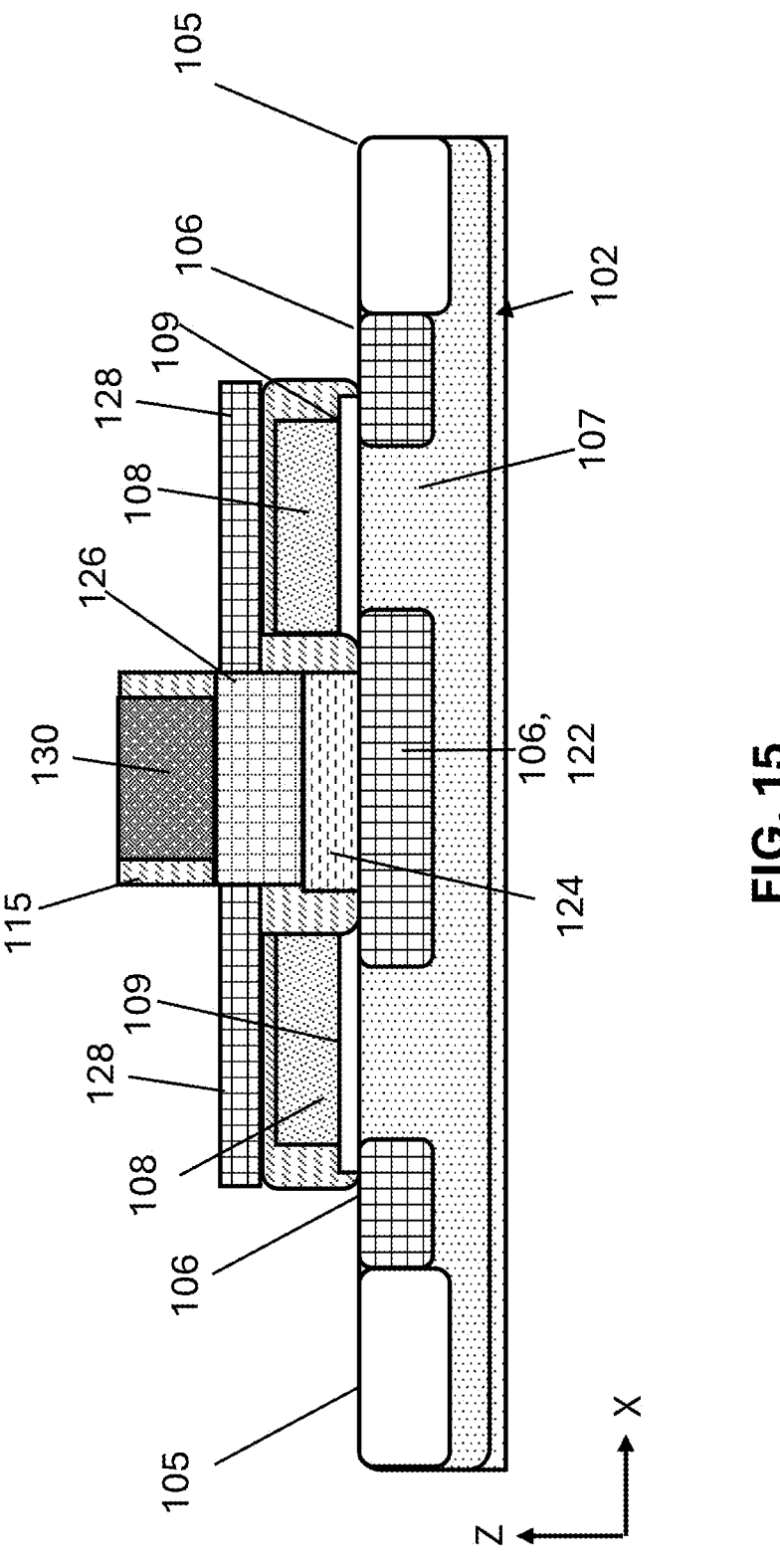

FIG. 15 illustrates further removing of insulator layer 105 and extrinsic base 128 material from locations horizontally beyond gate conductors 108. For example, a temporary mask (not shown) may cover gate conductors 108 and emitter 130 to enable removing of gate dielectric layer 109 and extrinsic base 128 in locations not covered by such a mask. The removing may be implemented by non-selective and/or selective etching of doped semiconductor material (e.g., extrinsic base 128 material not covered by a mask) and insulative material (e.g., portions of insulator layer(s) 105) thereunder.

Figure 16:
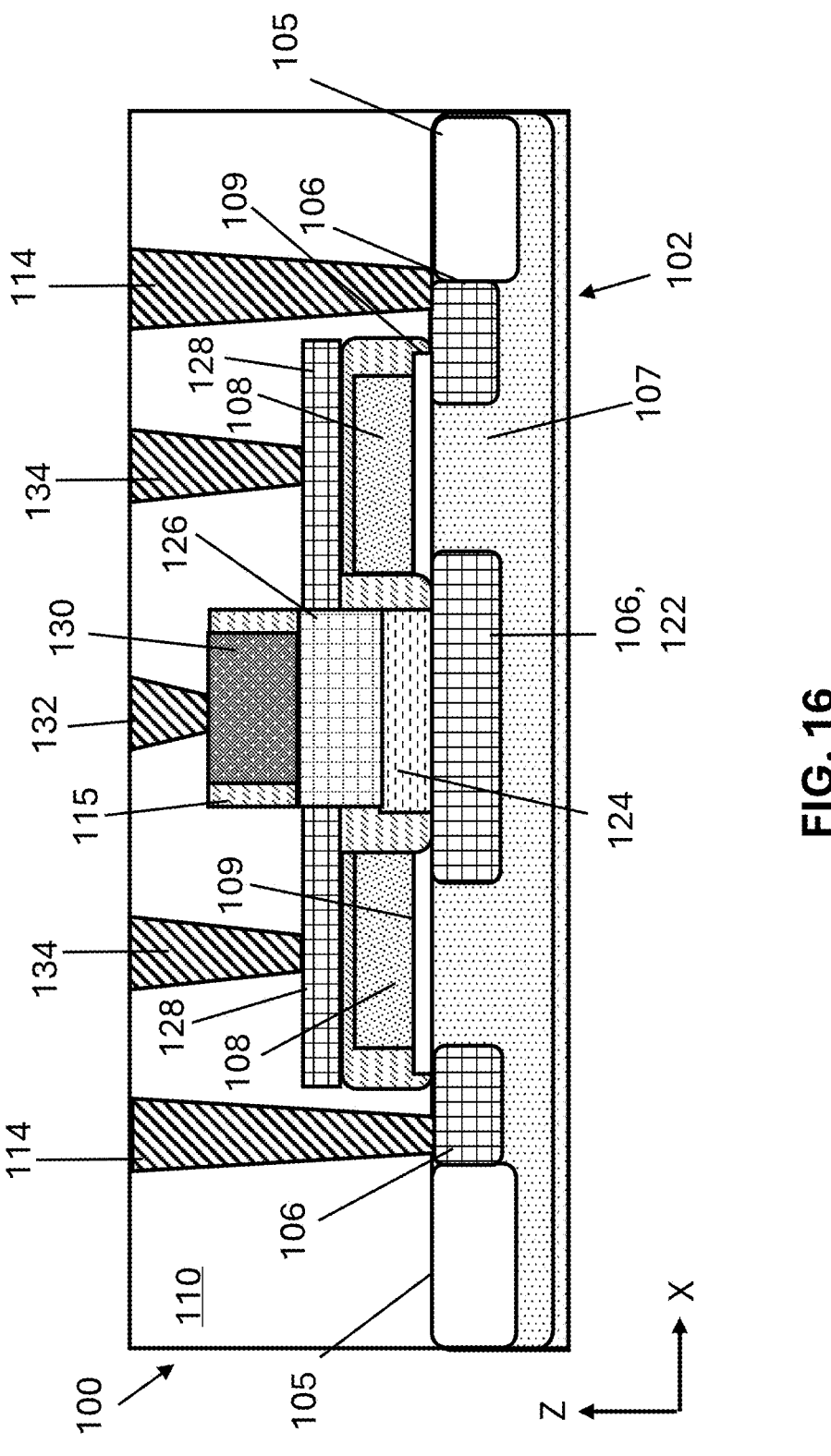

FIG. 16 depicts remaining processes to form structure 100, e.g., forming ILD layer 110 to cover insulator layer(s) 105, S/D terminal(s) 106, spacer(s) 115, extrinsic base(s) 128, spacer(s), emitter 130, etc. With ILD layer 110 in place, openings (not shown) may be formed therethrough and filled with conductive material(s), refractory metal liners, etc., as discussed herein to provide contact(s) 112 (not shown), 114, 132, 134, 136 (not shown), where desired. Where not depicted in FIG. 16, these contacts may be located outside the plane of the page, e.g., as shown and discussed in other embodiments.

Figure 17:
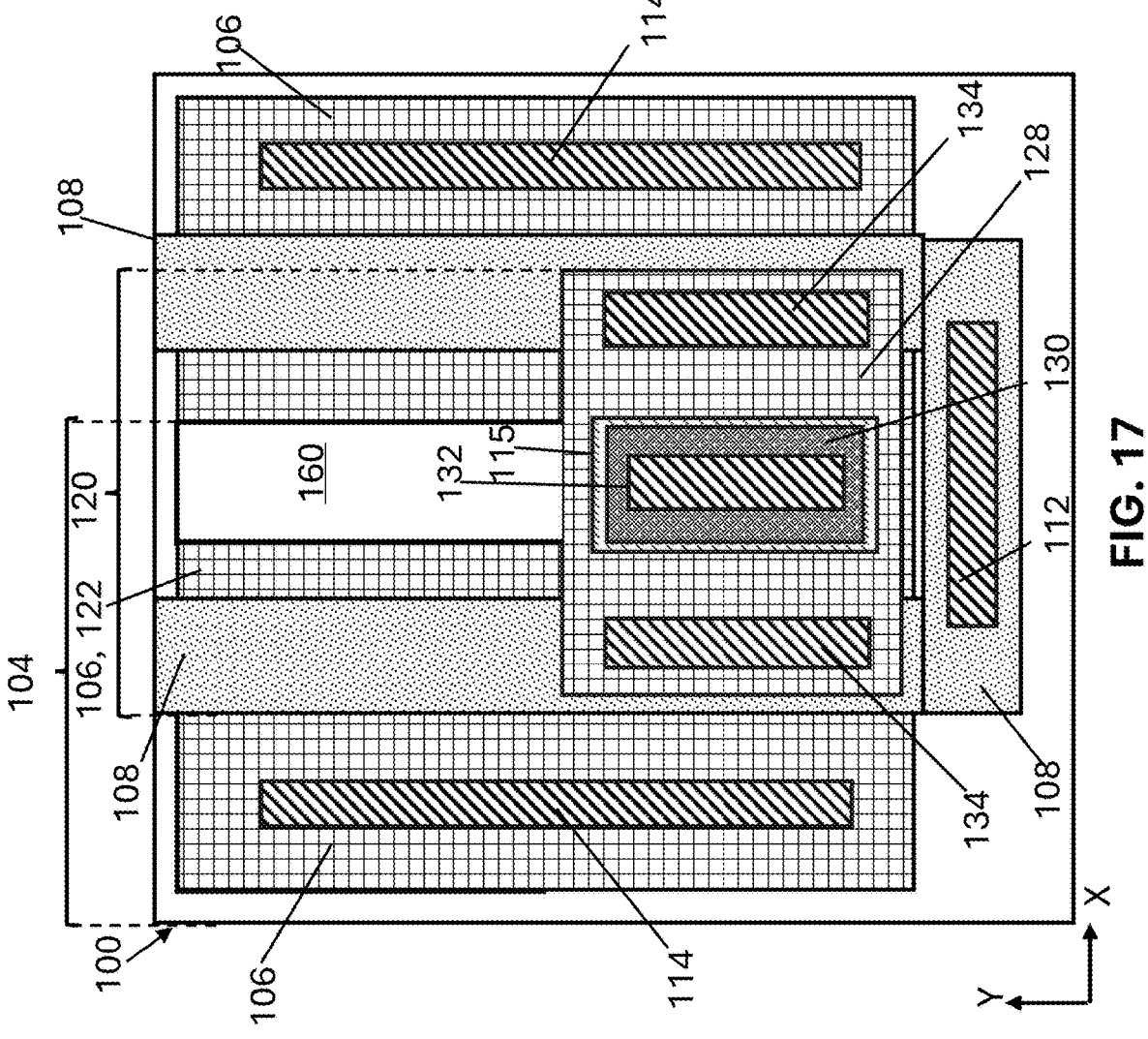
FIGS. 17-20 depict plan views of structures according to various further embodiments of the disclosure.

FIG. 17 depicts further configurations of structure 100 in which the scale of FET structure 104 (e.g., along the Y axis as shown) may be different from that of BT structure 120. In certain implementations, larger gate conductors 108 may be desirable e.g., to control the threshold voltage for operating FET structures 104, whereas corresponding expansions in the size of BT structure 120 may be undesirable. For control over such operating characteristics, S/D terminals 106 and gate conductors 108 may have an expanded length relative to BT structure 120 (e.g., S/D terminals 106, gate conductors 108, S/D contacts 114, etc., may be twice as large or perhaps larger than corresponding portions of BT structure 120). To prevent unintentional shorting between the structures 104, 120, intra-terminal insulators 160 may be located between adjacent FET structures 104 and/or alongside BT structure(s) 104 within structure 100. Intra-terminal insulators 160 may include any currently known or later developed dielectric materials described herein, and where desired may include air gaps and/or other electrically insulative materials or regions.

Figure 18:
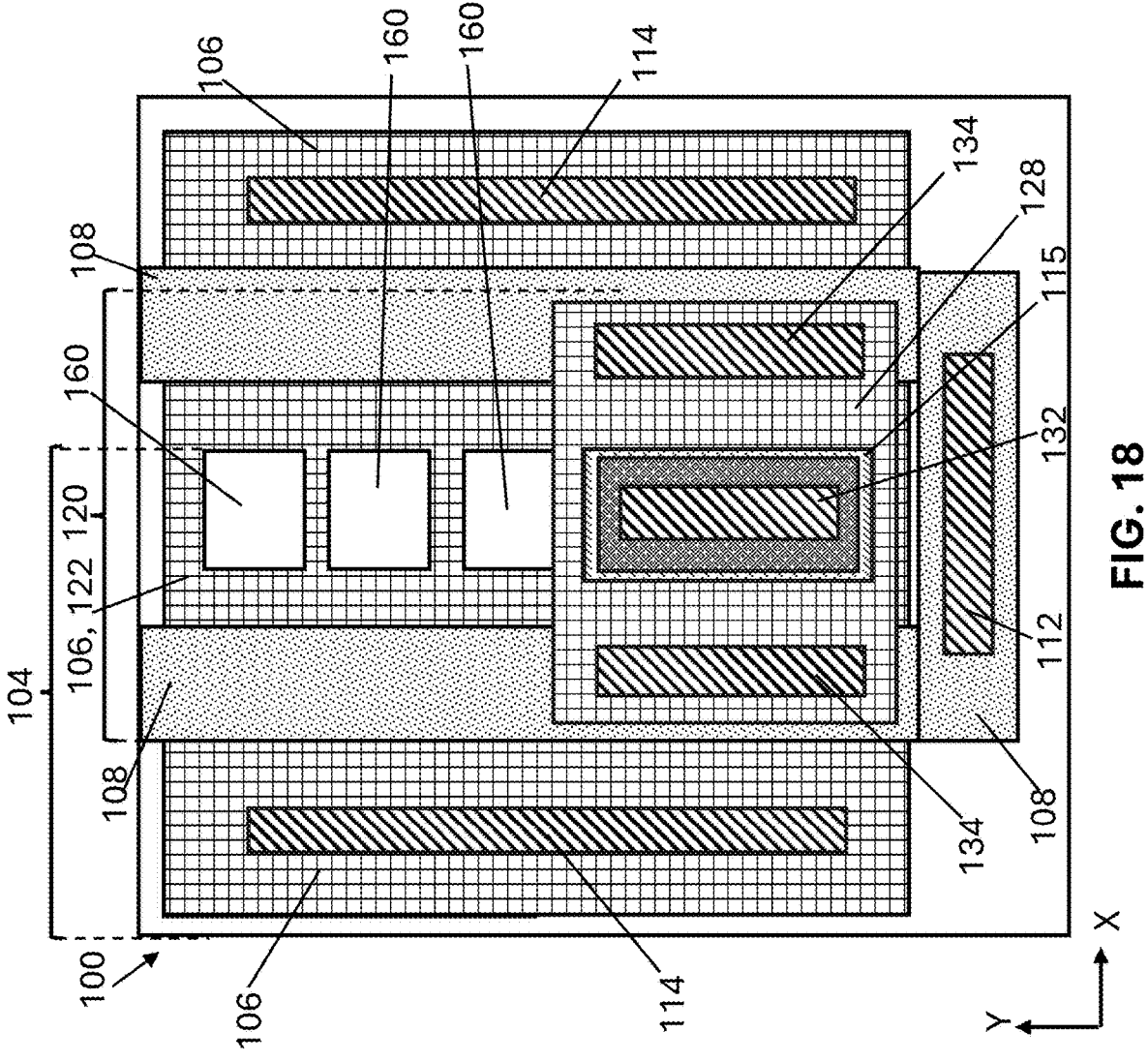
Figure 19:
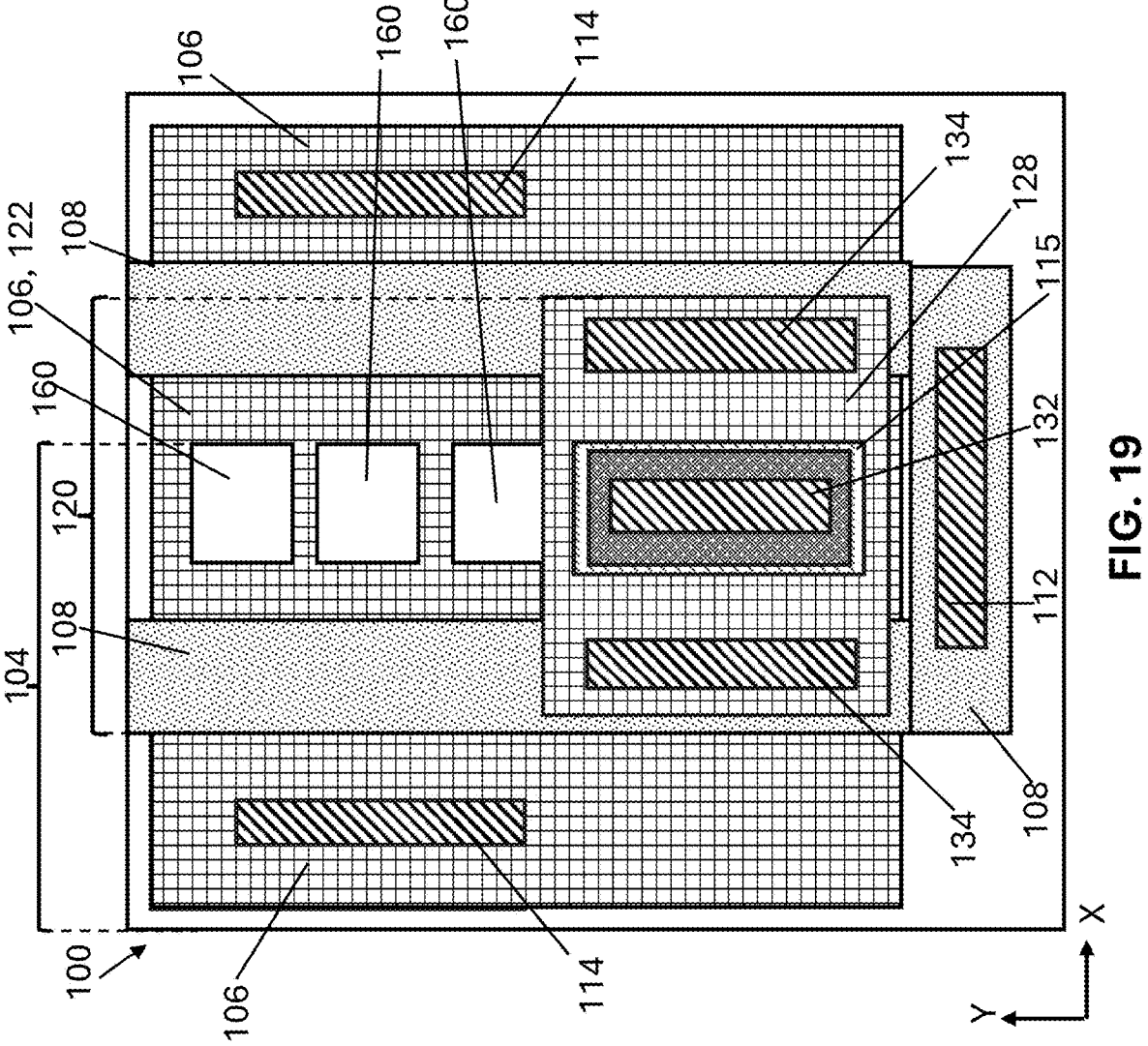

FIGS. 18 and 19 depict further examples of structure 100 in which the size, shape, and number of intra-terminal insulators 160 may vary to further control the conductivity of S/D terminals 106 (and/or subcollectors 122, when coextensive with S/D terminals 106). For instance, intra-terminal insulators 160 may be provided as a plurality of intra-terminal insulators 160 within S/D terminal 106 and/or subcollector 122. Intra-terminal insulators 160 may be located horizontally outside BT structure 120 (e.g., separated along Y-axis as shown) to reduce substrate capacitance and to control internal properties of BT structure 120 (e.g., reduce capacitance between collector and source). Intra-terminal insulators 160 may have a boundary along the perimeter of extrinsic base 128, such that intra-terminal insulator(s) 160 are optionally surrounded by S/D terminal 106 and subcollector 122. Any number and/or size of intra-terminal insulators 160 may be provided to suit particular technical purposes. As shown specifically in FIG. 19, the size and location of S/D contacts 114 also may vary in various implementations. FIG. 19 in particular staggers the position of S/D contacts 114 relative to BT structure 120 along the Y-axis to further reduce input to output capacitance in structure 100 during operation. Specifically, S/D contacts 114 are out of plane with BT structure 120 along the X-axis. Such benefits may arise, e.g., from additional amounts of S/D terminals 106 physically separating S/D contacts 114 from BT structure 120.

Figure 20:
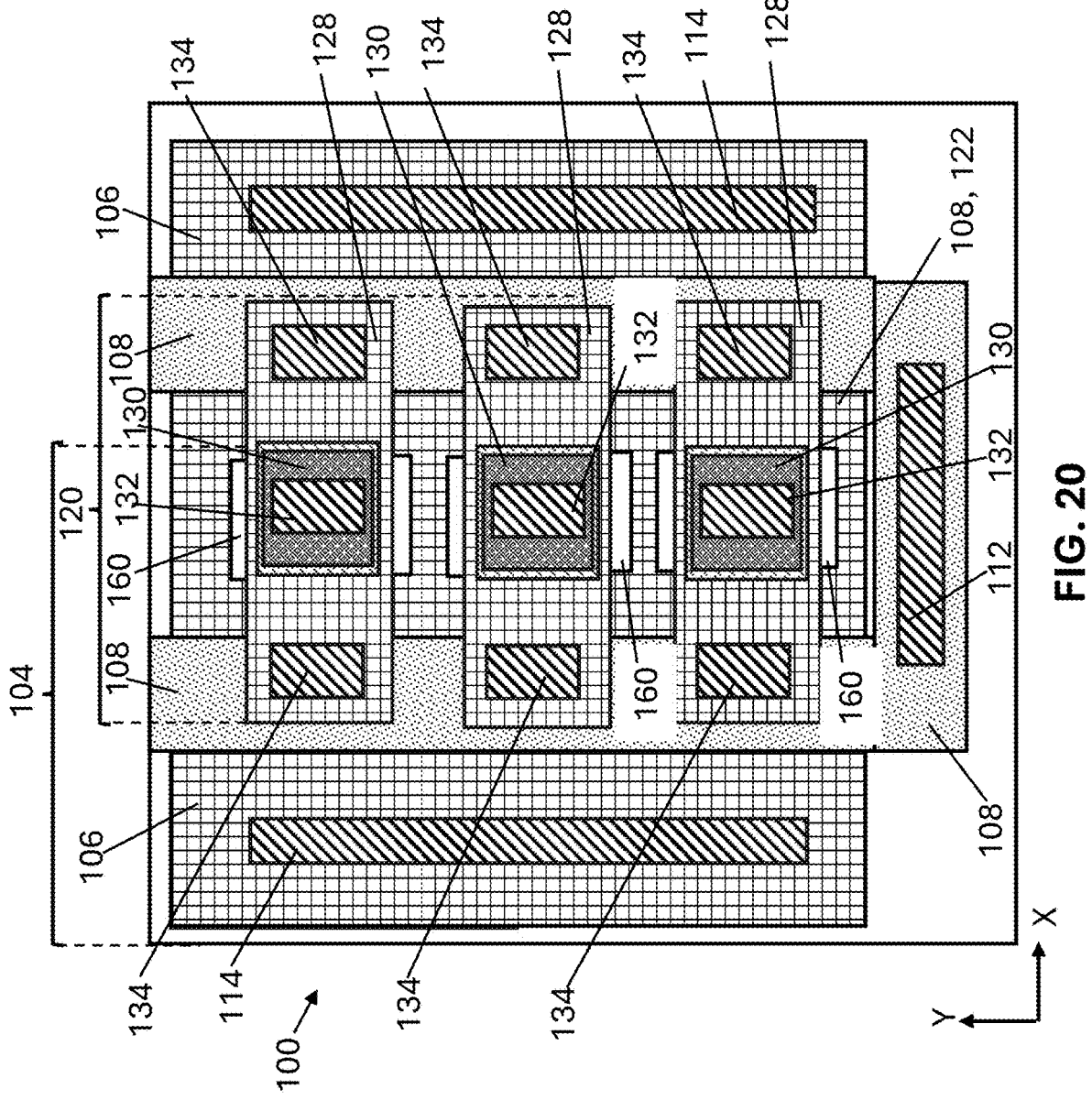

FIG. 20 depicts yet another configuration of structure 100 in which multiple BT structures 120 may be provided adjacent and/or between FET structures 104. Each BT structure 120 may take the form of similarly or identically shaped "fingers" horizontally between S/D terminals 106, each sharing one S/D terminal 108 and subcollector 122 therebelow. Additional BT structures 120 may provide benefits such as, e.g., lower source and collector resistance during operation. The use of multiple, smaller BT structures 120 may improve base resistance during operation by providing a larger number of current pathways. The BT structures 120 may be intercoupled at their emitters 130 and extrinsic bases 128 to function similarly identically to one BT structure 120, where desired.

Embodiments of the disclosure provide various technical and commercial advantages, examples of which are discussed herein. For example, by structurally intercoupling FET structures and BT structures over the same portion of a substrate, significant reductions in surface area (e.g., sixty percent or more) are achievable as compared to forming a FET and BT structure in horizontally distal areas of a device. In addition to surface area efficiency, in another example, the disclosure provides reduced capacitance within the BT structure(s) (e.g., from collector to base and from collector to source) during operation, thereby improving electrical performance. The absence of additional metal wires or vias to S/D terminals that are adjacent (and, optionally, coextensive with) a subcollector also inherently reduces metal wiring resistance and/or the need for additional components in overlying metal levels.

The method and structure as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a field effect transistor (FET) structure including:
a source/drain (S/D) terminal within a semiconductor layer, and
a gate structure on the semiconductor layer;
a bipolar transistor (BT) structure on the FET structure, the BT structure including:
a subcollector within the semiconductor layer, and
a collector-base-emitter stack on the subcollector and above the semiconductor layer; and
an intra-terminal insulator within a portion of the S/D terminal distal to the collector-base-emitter stack wherein the S/D terminal horizontally surrounds the intra-terminal insulator.

2. The structure of claim 1, wherein the subcollector is coextensive with the S/D terminal.

3. The structure of claim 1, wherein a lower surface of the subcollector is below a lower surface of the S/D terminal.

4. The structure of claim 3, further comprising a silicide layer partially within the S/D terminal and partially within the subcollector.

5. The structure of claim 1, wherein the gate structure includes:
a gate conductor over the semiconductor layer; and
a spacer horizontally between the gate conductor and the collector-base-emitter stack.

6. The structure of claim 1, further comprising an additional FET structure including:
an additional gate structure over the semiconductor layer, wherein the BT structure is horizontally between the gate structure and the additional gate structure; and
an additional S/D terminal within the semiconductor layer.

7. The structure of claim 6, wherein the subcollector is coextensive with the S/D terminal and the additional S/D terminal.

8. A structure comprising:
a field effect transistor (FET) structure including:
a source/drain (S/D) terminal within a semiconductor layer, and
a gate structure on the semiconductor layer;
a bipolar transistor (BT) structure on the FET structure, the BT structure including:
a subcollector within the semiconductor layer, wherein the S/D terminal is coextensive with the subcollector, and
a collector-base-emitter stack on the subcollector and above the semiconductor layer, wherein the collector-base-emitter stack is horizontally adjacent the gate structure; and
an intra-terminal insulator within a portion of the S/D terminal distal to the collector-base-emitter stack wherein the S/D terminal horizontally surrounds the intra-terminal insulator.

9. The structure of claim 8, wherein the gate structure includes:
a gate conductor over the semiconductor layer;
a first gate dielectric layer vertically between the semiconductor layer and the gate conductor; and
a second gate dielectric layer horizontally between the gate conductor and the collector-base-emitter stack.

10. The structure of claim 8, wherein a length of the S/D terminal is greater than a length of the collector-base-emitter stack.

11. The structure of claim 8, wherein the subcollector is free of conductive contacts thereon.

12. The structure of claim 8, further comprising:
an additional gate structure over the semiconductor layer, wherein the collector-base-emitter stack is horizontally between the gate structure and the additional gate structure; and
an additional S/D terminal within the semiconductor layer, wherein the additional gate structure is between the subcollector and the additional S/D terminal.

13. The structure of claim 12, wherein the additional S/D terminal has a same doping profile as the subcollector and the S/D terminal.

14. The structure of claim 12, wherein the subcollector is coextensive with the S/D terminal and the additional S/D terminal.

15. A method comprising:
forming a field effect transistor (FET) structure including:
a source/drain (S/D) terminal within a semiconductor layer, and
a gate structure on the semiconductor layer;
forming a bipolar transistor (BT) structure on the FET structure, the BT structure including:
a subcollector within the semiconductor layer, and
a collector-base-emitter stack on the subcollector and above the semiconductor layer; and forming an intra-terminal insulator within a portion of the S/D terminal distal to the collector-base-emitter stack wherein the S/D terminal horizontally surrounds the intra-terminal insulator.

16. The method of claim 15, wherein forming the BT structure causes the subcollector to be coextensive with the S/D terminal.

17. The method of claim 15, further comprising forming a silicide layer partially within the S/D terminal and partially within the subcollector, wherein a lower surface of the subcollector is below a lower surface of S/D terminal.

18. The method of claim 15, wherein forming the gate structure includes:

forming a gate conductor over the semiconductor layer; and forming a spacer horizontally between a gate conductor and the collector-base-emitter stack.

19. The method of claim 15, further comprising forming an additional FET structure including:

an additional gate structure over the semiconductor layer, wherein the BT structure is horizontally between the gate structure and the additional gate structure; and an additional S/D terminal within the semiconductor layer.

20. The method of claim 19, wherein forming the additional FET structure causes the subcollector to be coextensive with the S/D terminal and the additional S/D terminal.

\* \* \* \* \*